US012608520B2

(12) United States Patent
Atkins et al.

(10) Patent No.: US 12,608,520 B2
(45) Date of Patent: Apr. 21, 2026

(54) INTELLIGENT BIT DESIGN

(71) Applicant: Halliburton Energy Services, Inc., Houston, TX (US)

(72) Inventors: William Brian Atkins, Houston, TX (US); Radompon Sungkorn, Katy, TX (US); Michael Stephen Pierce, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 1199 days.

(21) Appl. No.: 17/595,104

(22) PCT Filed: Jun. 10, 2019

(86) PCT No.: PCT/US2019/036362
§ 371 (c)(1),
(2) Date: Nov. 9, 2021

(87) PCT Pub. No.: WO2020/251536
PCT Pub. Date: Dec. 17, 2020

(65) Prior Publication Data
US 2022/0222401 A1 Jul. 14, 2022

(51) Int. Cl.
*G06F 30/27* (2020.01)
*G06F 30/17* (2020.01)

(52) U.S. Cl.
CPC .............. *G06F 30/27* (2020.01); *G06F 30/17* (2020.01)

(58) Field of Classification Search
CPC .......... G06F 30/00; G06F 30/27; G06F 30/17; G06F 30/23; G06N 3/0464; G06N 3/08; G06N 3/09

USPC .......................................................... 703/7, 6
See application file for complete search history.

(56) References Cited

U.S. PATENT DOCUMENTS

| | | | |
|---|---|---|---|
| 4,928,521 | A | 5/1990 | Jardine |
| 5,021,675 | A | 6/1991 | Fischer |
| 5,730,234 | A | 3/1998 | Putot |
| 5,871,391 | A | 2/1999 | Pryor |

(Continued)

FOREIGN PATENT DOCUMENTS

| | | | |
|---|---|---|---|
| CN | 106023137 | 10/2016 | |
| WO | WO-2009079371 A1 * | 6/2009 | ............... E21B 7/04 |

(Continued)

OTHER PUBLICATIONS

Soars, Cesar et al., "Real-Time Predictive Capabilities of Analytical and Machine Learning Rate of Penetration (ROP) Models", Sep. 6, 2018, Journal of Petroleum Science and Engineering, Elsevier B.V. (Year: 2018).*

(Continued)

*Primary Examiner* — Cedric Johnson
(74) *Attorney, Agent, or Firm* — DeLizio, Peacock, Lewin & Guerra, LLP

(57) ABSTRACT

A method includes determining a bit design based on a design criterion, determining a cutter design to be mounted on the bit design at a bit design position based on cutter information, wherein the cutter information is based on a historical cutter performance metric of one or more cutters having the cutter design. The method also includes generating a drill bit model based on the bit design and the cutter design and determining that the drill bit model meets the design criterion.

18 Claims, 11 Drawing Sheets

(56)     References Cited

U.S. PATENT DOCUMENTS

| | | | |
|---|---|---|---|
| 7,372,977 | B2 | 5/2008 | Fujimura et al. |
| 8,374,835 | B2 | 2/2013 | Lind et al. |
| 8,738,342 | B2 | 5/2014 | Lind et al. |
| 8,760,668 | B1 | 6/2014 | Wiggins et al. |
| 9,792,530 | B1 | 10/2017 | Wu et al. |
| 11,578,583 | B2 | 2/2023 | Samuel |
| 2002/0138240 | A1 | 9/2002 | Jelley et al. |
| 2005/0096847 | A1 | 5/2005 | Huang et al. |
| 2007/0093996 | A1* | 4/2007 | Cariveau ............... E21B 10/55 703/7 |
| 2008/0040084 | A1 | 2/2008 | Huang |
| 2008/0262810 | A1 | 10/2008 | Moran et al. |
| 2012/0290206 | A1 | 11/2012 | Hartmann et al. |
| 2015/0287150 | A1 | 10/2015 | Meerdo et al. |
| 2015/0314411 | A1 | 11/2015 | Samukawa et al. |
| 2017/0032061 | A1 | 2/2017 | Izbinski et al. |
| 2018/0181105 | A1 | 6/2018 | Shindou |
| 2018/0246494 | A1 | 8/2018 | Nakahama |
| 2019/0145183 | A1 | 5/2019 | Potash |
| 2021/0174486 | A1 | 6/2021 | Chowhan |
| 2022/0168862 | A1 | 6/2022 | Atkins et al. |
| 2022/0282609 | A1 | 9/2022 | Samuel |

FOREIGN PATENT DOCUMENTS

| | | | |
|---|---|---|---|
| WO | 2018033549 | A1 | 2/2018 |
| WO | 2020251534 | A1 | 12/2020 |
| WO | 2020251535 | A1 | 12/2020 |

OTHER PUBLICATIONS

Akbari, B. et al. "Dynamic Single PDC Cutter Rock Drilling Modeling and Simulations Focusing on Rate of Penetration Using Distinct Element Method", Jun. 26-29, 2011, 45th US Rock Mechanics/ Geomechanics, American Rock Mechanics Association. (Year: 2011).*

"U.S. Appl. No. 17/594,147, Restriction Requirement", Jan. 10, 2024, 7 pages.

"U.S. Appl. No. 17/594,161, Non-Final Office Action", Jan. 5, 2024, 23 pages.

PCT Application Serial No. PCT/US2019/036343, International Search Report, mailed Mar. 6, 2020, 3 pages.

PCT Application Serial No. PCT/US2019/036343, Written Opinion, mailed Mar. 6, 2020, 8 pages.

PCT Application Serial No. PCT/US2019/036353, International Search Report, mailed Mar. 9, 2020, 6 pages.

PCT Application Serial No. PCT/US2019/036353, Written Opinion, mailed Mar. 9, 2020, 7 pages.

PCT Application Serial No. PCT/US2019/036362, International Search Report, mailed Mar. 5, 2009, 4 pages.

PCT Application Serial No. PCT/US2019/036362, Written Opinion, mailed Mar. 5, 2009, 5 pages.

"U.S. Appl. No. 17/594,147, Non-Final Office Action", Mar. 21, 2024, 18 pages.

* cited by examiner

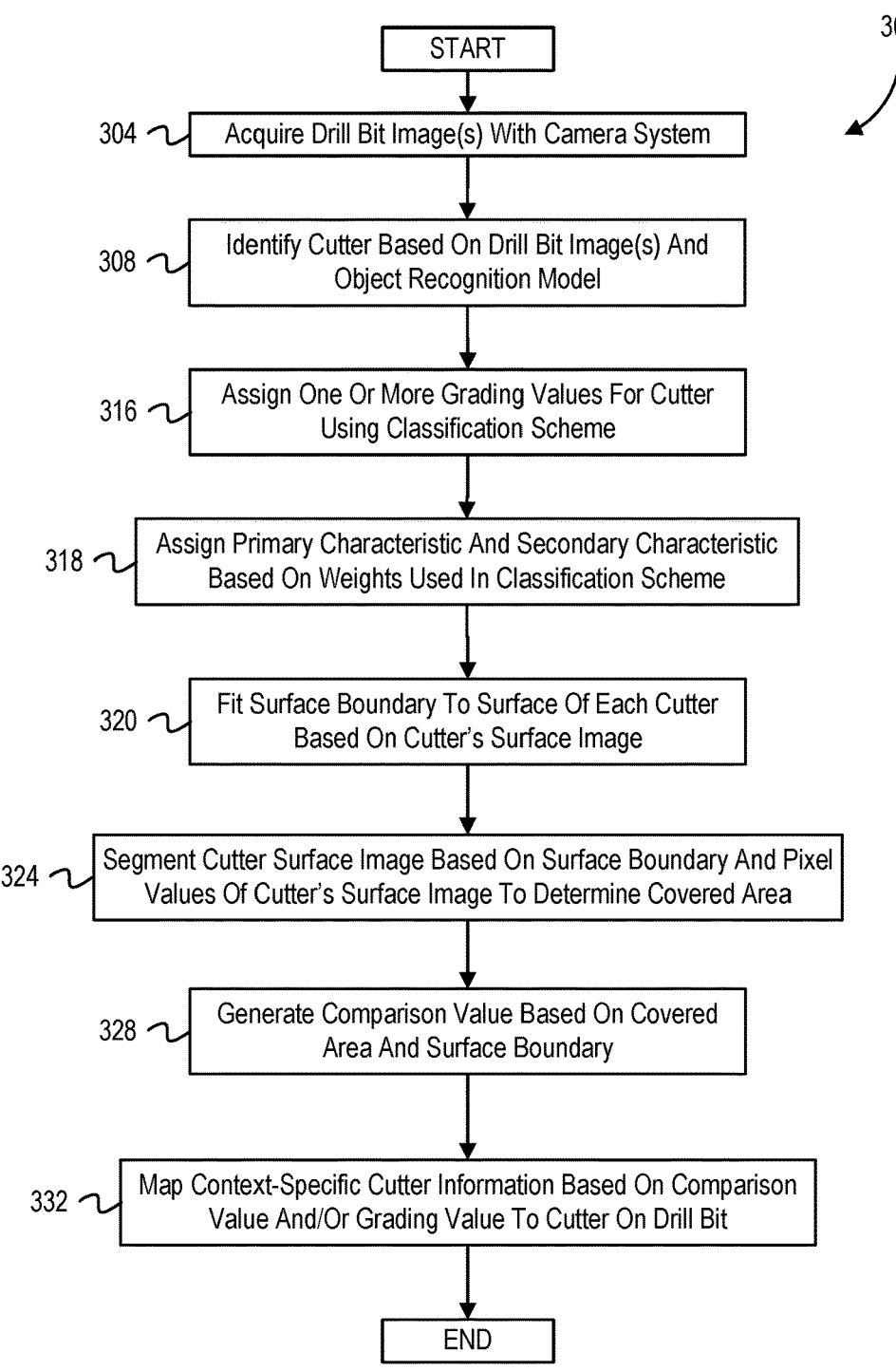

START

304 — Acquire Drill Bit Image(s) With Camera System

308 — Identify Cutter Based On Drill Bit Image(s) And Object Recognition Model

316 — Assign One Or More Grading Values For Cutter Using Classification Scheme

318 — Assign Primary Characteristic And Secondary Characteristic Based On Weights Used In Classification Scheme 320 — Fit Surface Boundary To Surface Of Each Cutter Based On Cutter's Surface Image 324 — Segment Cutter Surface Image Based On Surface Boundary And Pixel Values Of Cutter's Surface Image To Determine Covered Area 328 — Generate Comparison Value Based On Covered Area And Surface Boundary 332 — Map Context-Specific Cutter Information Based On Comparison Value And/Or Grading Value To Cutter On Drill Bit

END

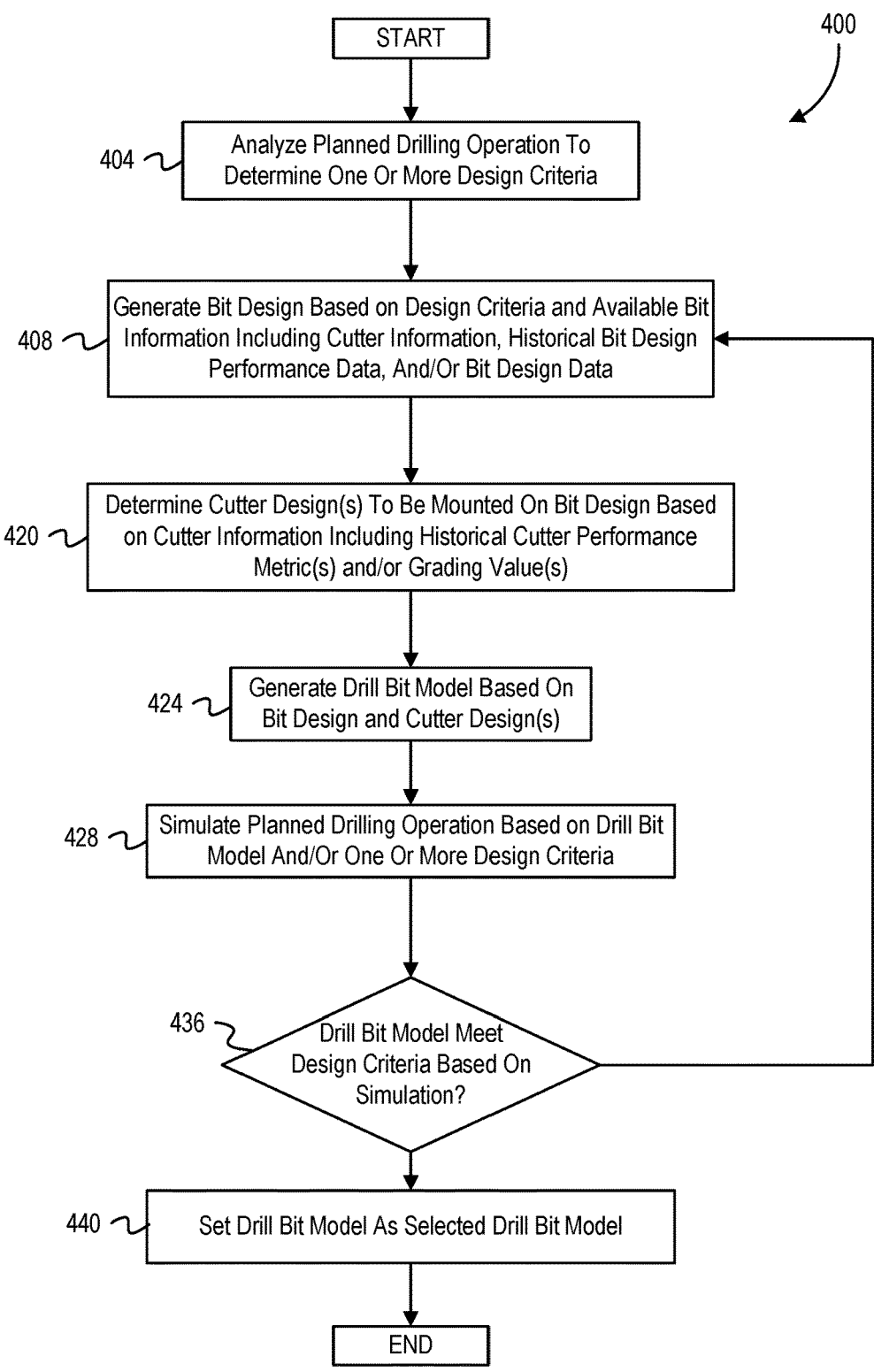

START

400

404 — Analyze Planned Drilling Operation To Determine One Or More Design Criteria 408 — Generate Bit Design Based on Design Criteria and Available Bit Information Including Cutter Information, Historical Bit Design Performance Data, And/Or Bit Design Data 420 — Determine Cutter Design(s) To Be Mounted On Bit Design Based on Cutter Information Including Historical Cutter Performance Metric(s) and/or Grading Value(s)

424 — Generate Drill Bit Model Based On Bit Design and Cutter Design(s)

428 — Simulate Planned Drilling Operation Based on Drill Bit Model And/Or One Or More Design Criteria 436 — Drill Bit Model Meet Design Criteria Based On Simulation?

440 — Set Drill Bit Model As Selected Drill Bit Model

END

FIG. 4

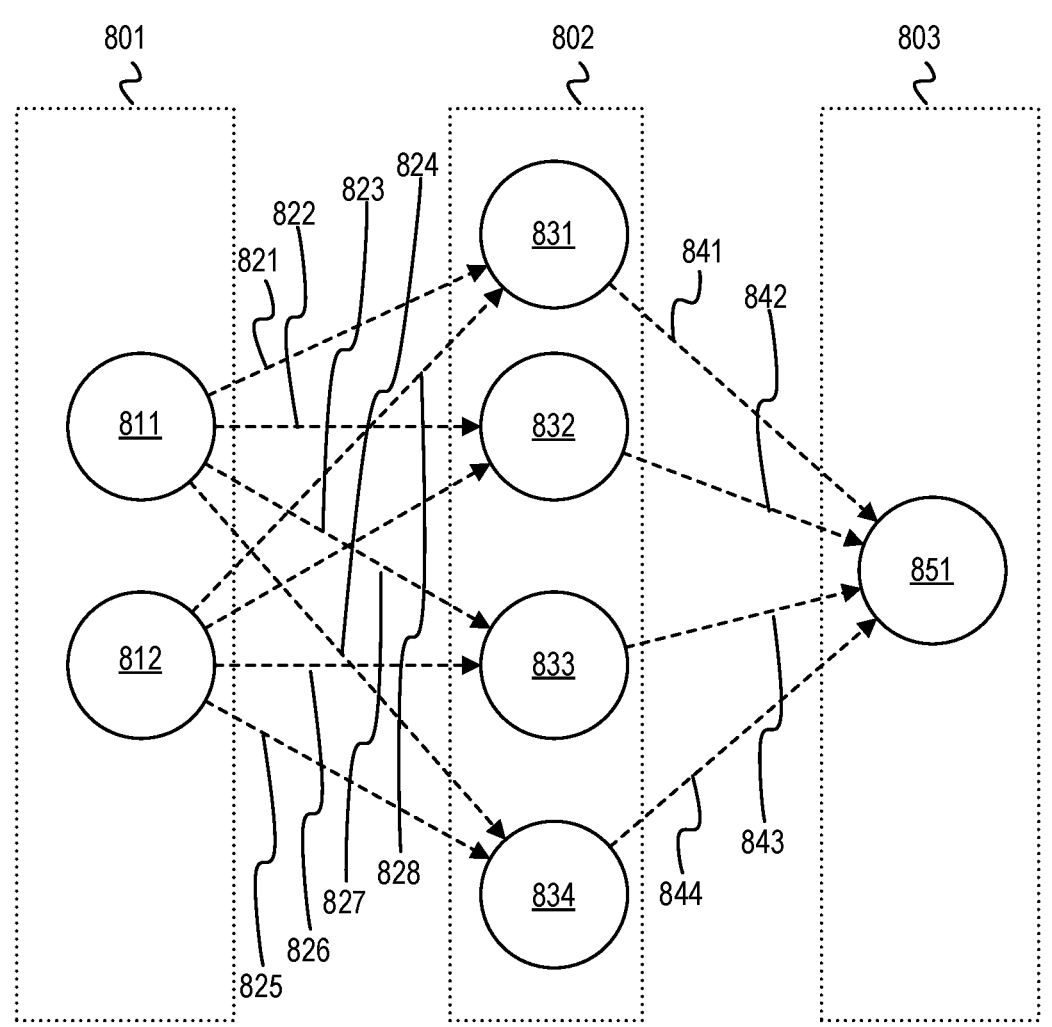
FIG. 8

INTELLIGENT BIT DESIGN

BACKGROUND

The disclosure generally relates to the field of drill bit design, and more particularly to bit cutter designs.

Boreholes may be drilled into the Earth using a drill bit having a plurality of cutters disposed on a bit body. The cutters may include super-hard, wear-resistant materials such as a polycrystalline diamond compact (PDC) secured to a tungsten carbide substrate. During drilling, physical contact between the cutters and the material being drilled will eventually wear or otherwise degrade the cutters, despite the use of these materials.

BRIEF DESCRIPTION OF THE DRAWINGS

Embodiments of the disclosure may be better understood by referencing the accompanying drawings.

FIG. 3 is a flowchart of operations to map context-specific cutter information to a cutter.

FIG. 4 is a flowchart of operations to generate a bit design.

FIG. 8 is an example neural network used to identify a cutter, and determine grading values and/or characteristics of the identified cutter.

DETAILED DESCRIPTION

Figure 1:
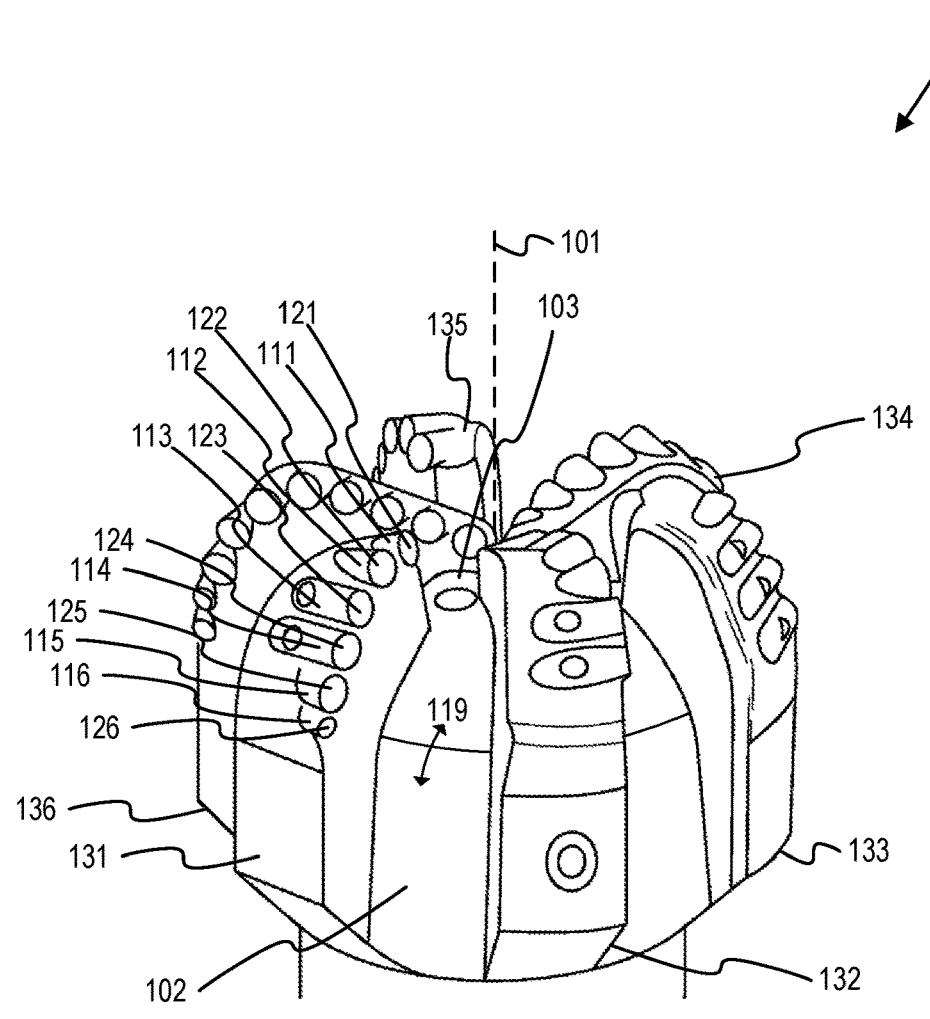
FIG. 1 is an isometric view of a drill bit.

The description that follows includes example systems, methods, techniques, and program flows that embody elements of the disclosure. However, it is understood that this disclosure can be practiced without these specific details. For instance, this disclosure refers to round cutters. Aspects of this disclosure can instead be applied to other cutter shapes such as triangular cutters, rectangular cutters, conical cutters, etc. In other cases, well-known instruction instances, protocols, structures and techniques have not been shown in detail in order not to obfuscate the description.

Various embodiments can relate to a model generation system and related model generation methods for generating a drill bit model comprising a bit design and one or more cutter designs. The model generation system can analyze planned drilling operation information of a planned drilling operation to determine one or more design criteria for a drill bit to be used for the planned drilling operation. The model generation system can generate a bit design based on the one or more design criteria and available bit or cutter information. The model generation system can then determine one or more cutter designs to be mounted on the bit design using the cutter information, wherein the cutter information can be based on one or more historical cutter performance metrics and/or one or more cutter design grading values.

The cutter design grading values can be determined using a machine-learning framework, wherein the machine-learning framework can include one or more neural networks. Training the machine-learning framework can include training at least one of the neural networks. The machine-learning framework can be trained using a set of cutter training images as inputs and a corresponding set of training design grading values as target values in the objective function(s) used to optimize the neural network(s) of the machine-learning framework during training, wherein the training design grading values include design grading. In some embodiments, the machine-learning framework can also use training historical cutter performance metrics as inputs during training as well. The model generation system can generate a drill bit model based on the bit design and the one or more cutter designs using a simulation to determine whether the drill bit model meets the one or more design criteria for the planned drilling operation.

In some embodiments, the model generation system can include an information acquisition system that acquires historical cutter performance metrics and cutter grading values. In some embodiments, the model generation system can analyze an image of a drill bit to identify one or more cutters and corresponding cutter positions on the drill bit. The model generation system can assign the grading values to the cutters based on cutter characteristics. In addition, the model generation system can determine one or more quantitative measurements of the physical integrity of one or more cutters using various image-analysis methods, such as by measuring the covered region on the surface of the cutter covered by a cutting material such as PDC using a brightness threshold. The model generation system can combine these measurements to generate historical cutter performance metrics that correlate to quantitative performance values. The system can associate these historical cutter performance metrics to the cutter design corresponding with the measured cutters and/or the cutter positions on a bit design. The model generation system can then use the historical cutter performance metrics and grading values when determining one or more cutter designs for the bit design and simulate a drilling operation based on the one or more cutter designs and bit designs.

The model generation system can be used to generate an improved drill bit model during a drilling operation based on the operation-specific design criteria. For example, in contrast to bit design based only on bit design data, incorporation of cutter information such as historical cutter performance metrics based on a cutter covered region can provide greater accuracy when determining a set of cutters for the bit design capable of surviving a drilling operation having the operation-specific design criteria with minimal cutter degradation. With the addition of cutter information, drilling operations can be improved in a very practical way, by providing more accurate and consistent information as to: when a drill bit should be examined, when a drill bit cutter should be rotated, and/or when a drill bit cutter should be replaced. In addition, the model generation system can determine that certain positions on a bit design can be replaced with lower-durability cutters based on the design criteria, increasing the operational viability when particular cutter designs are not available. Example well operations that can be improved in this manner can include drilling operations, fishing operations, well stimulation operations, and/or well injection operations.

Example Drill Bit and Drill Bit Image Acquisition System

FIG. 1 is an isometric view of a drill bit. In FIG. 1, the drill bit 100 is adapted for drilling through formations of rock to generate a borehole. Drill bit 100 includes a bit axis 101, a bit face 103 formed on the end of the drill bit 100 and drill blades 131-136. The drill blades 131-136 can be angularly spaced-apart, extending from the bit body 102, and be integrally formed as part of the bit body 102. The drill blades 131-136 extend radially across the bit face 103 and longitudinally along a portion of the periphery of the drill bit 100. It should be understood that as used herein, the term "radial" or "radially" refers to positions or movement substantially perpendicular to the direction of bit axis 101. In addition, it should be understood that as used herein, the term "axial," "axially," or "longitudinally" refers to positions or movement generally parallel to the direction of bit axis 101.

Bit cutters are mounted on the drill blades 131-136. The drill blades 131-136 are separated by grooves which define drilling fluid flow paths 119 between and along the cutting faces of the bit cutters. Forces applied to material surrounding the faces of bit cutters distributed along the bottom and side of the drill blades can be used to drill away the material. For example, the bit cutters 111-116 distributed along the bottom and side of the drill blade 131 can apply force to a material via their respective cutter surfaces 121-126. While the bit cutters 111-116 are shown as round cutters, the bit cutters on the drill bit 100 can have many other shapes.

In some embodiments, a system can store a three-dimensional (3D) model of the drill bit 100 that includes identifier values for cutters in the 3D model. For example, each of the bit cutters 111-116 can be associated with an identifier value in the 3D model such as a string "bit1-blade3-cutter003x-type3" or a numeric identifier "0398621." As described further below, context-specific cutter information corresponding with each of the bit cutters 111-116 can be assigned to each cutter on the bit 100 via the cutter identifier, such that the information is mapped to its respective cutter.

Figure 2:
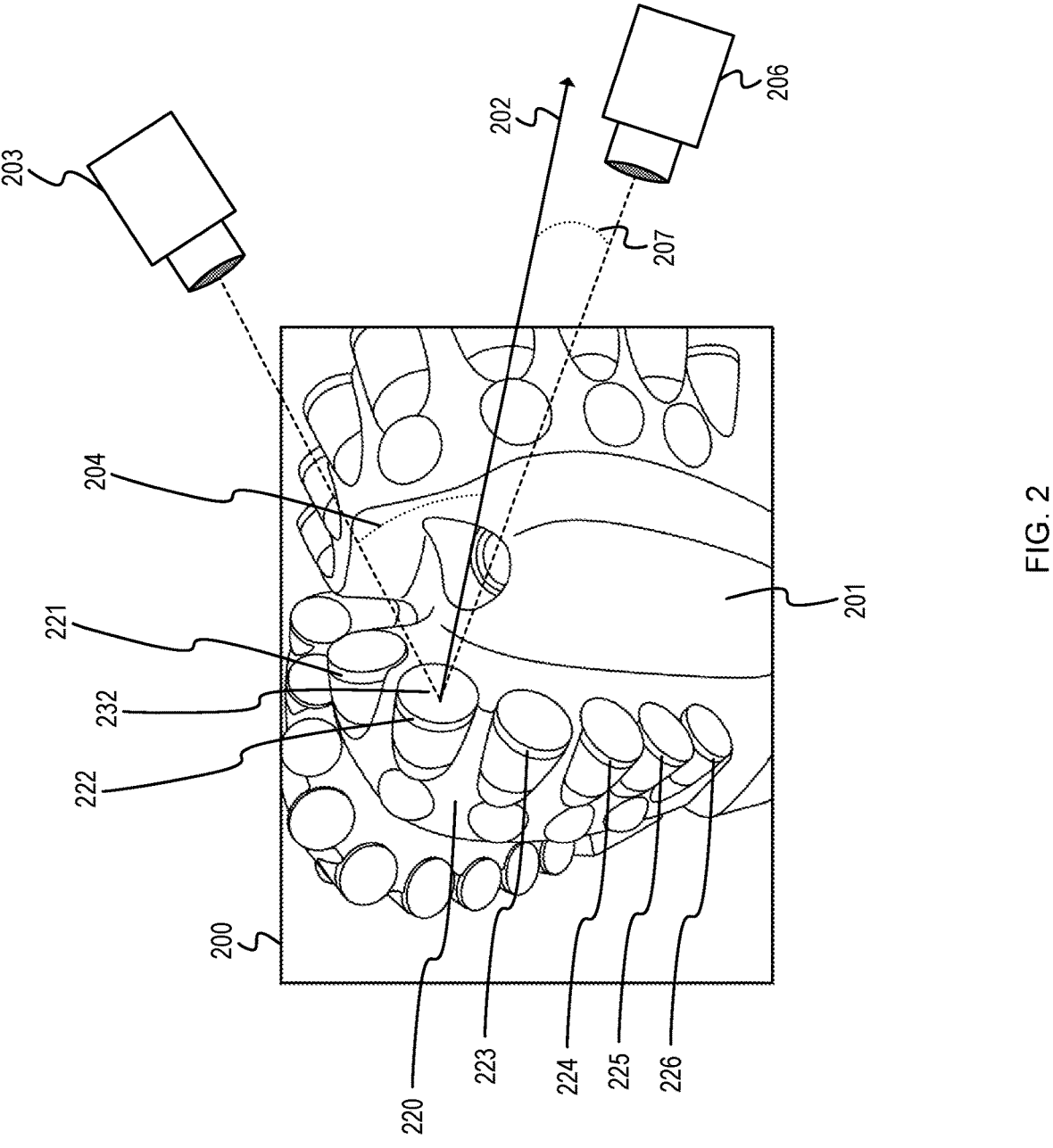
FIG. 2 is an isometric view of a drill bit portion and two different camera angles used to acquire images of the drill bit portion.

FIG. 2 is an isometric view of a drill bit portion and two different camera angles used to acquire images of the drill bit portion. The box 200 is an isometric view of a portion of a drill bit 201 that includes a drill blade 220. Drill bit 201 may be similar to or identical to drill bit 100 of FIG. 1.

Referring now to FIG. 2, it can be seen that the drill blade 220 includes a set of bit cutters 221-226 distributed along the drill blade. The bit cutters 221-226 are positioned at various positions along the drill blade 220, wherein the bit cutter 221 is at a bottom position of the drill bit 201, and wherein the bit cutter 226 is positioned at an end position, with cutters 222-225 spaced apart from each other, and positioned along the edge of the drill blade 220, between cutters 221 and 226.

A first camera 203 records an image of the drill bit 201 at a first camera angle 204 with respect to a cutter normal vector 202 that is normal to the cutter surface 232. A second camera 206 records an image of the drill bit 201 at a second camera angle 207 with respect to the cutter normal vector 202. In some embodiments, at least one of the first camera angle 204 and the second camera angle 207 can be between 30 degrees and 60 degrees. In some embodiments, the first camera 203 and/or the second camera 206 can capture an image of each blade of the drill bit 201 at the same angle with respect to the cutter normal vector for that respective blade. For example, the angles 204 and 207 may be equal in some embodiments.

In some embodiments, the field of vision for the first camera 203 and the second camera 206 can overlap. For example, images of the drill cutter 222 can be acquired by both the first camera 203 and the second camera 206, with at least a portion of the image acquired by first camera 203 overlapping a portion of the image acquired by the second camera 206.

In some embodiments, the first camera 203 and second camera 206 can be physically separate from the drill bit 201. Alternatively, in some embodiments, the first camera 203 and second camera 206 can be attached to a same bottom hole assembly as the drill bit 201.

Example Flowcharts

The flowcharts described below are provided to aid in understanding the illustrations and should not to be used to limit scope of the claims. Each flowchart depicts example operations that can vary within the scope of the claims. Additional operations may be performed; fewer operations may be performed; the operations shown may be performed in parallel; and the operations shown may be performed in a different order. For example, the operations depicted in blocks 304-332 of FIG. 3 can be performed in parallel or serially for multiple cutters on a drill bit. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus, for execution.

FIG. 3 is a flowchart of operations to map context-specific cutter information to a cutter. FIG. 3 depicts a flowchart 300 of operations to map cutter information using a system that includes a processor. For example, operations of the flowchart 300 can be performed using a system similar to the computer system 1098 or computer device 1100 shown in FIGS. 10-11, respectively. Operations of the flowchart 300 start at block 304.

At block 304, one or more drill bit images are acquired with a camera system. The camera system can include one or more cameras to acquire the drill bit images. In some embodiments, the one or more cameras of the camera system can be positioned within a range of angles with respect to a normal direction of a drill bit cutter surface. For example, a camera system can be positioned at an angle between a range of 30 degrees to 60 degrees with respect to a normal direction of a drill bit cutter surface.

At block 308, a device or system can operate to identify a cutter based on drill bit images and an object recognition model. In some embodiments, the device or system can use a deep learning system or other machine-learning framework that incorporates the object recognition model, wherein a deep learning system includes networks implementing hierarchical algorithms capable of unsupervised learning from unstructured/unlabeled datasets. The object recognition model can comprise a set of weights corresponding to nodes in a neural network of a machine-learning framework and can be generated by training the machine-learning framework. For example, an object recognition model can be represented by a hash table [01: 0.52, 02: 0.643, 03: 0.382, 04: 0.4642], wherein each key in the table represents a node connection and each value represents a weight corresponding to the node connection.

In some embodiments, the inputs for the machine-learning framework can be values based on sections of an image of a drill bit. For example, each of the sections of the image of the drill bit can be partitioned into an image size similar to or the same as the bounded region 634 shown in FIG. 6, and the inputs to the machine-learning framework may comprise brightness values of these sections. After processing the inputs through one or more layers of the machine-learning framework, the machine-learning framework can generate a cutter probability value, wherein a greater cutter probability value implies a greater probability of including a cutter. In some embodiments, the machine-learning framework can determine that an image section includes a cutter if the cutter probability value is greater than a cutter probability threshold.

In some embodiments, the device or system can also identify and/or further characterize a cutter based on a corresponding cutter position. The device or system can determine a cutter position based on the machine-learning-identified bit cutter and/or a 3D model of the drill bit. The cutter position can include one or more coordinates with respect to a bit axis.

For example, with reference to FIG. 1, the device or system can use machine-learning results to determine an approximate position of an identified cutter and compare the approximate position of the identified cutter to positions of the cutters 111-116 on a 3D drill bit model of the drill bit 100. The device or system can then determine that the approximate position is nearest to the position of the bit cutter 111 on the drill bit 100 and that thus the position of the identified cutter is the position of the bit cutter 111 on the drill bit 100.

At block 316, the device or system can assign one or more grading values for the cutter using a classification scheme. In some embodiments, the classification scheme can be implemented using the machine-learning framework, wherein the machine-learning framework is trained on a training set comprising cutter training images as inputs. In addition, the machine-learning framework can use a corresponding set of training design grading values for cutters as target values for the objective function used during training, wherein each of the training design grading values can be associated with one or more of the cutter training images. In some embodiments, the set of training design grading values can be labeled by subject matter experts (SMEs). In some embodiments, the classification scheme can also include an analysis of various characteristics such as worn teeth ("WT"), low bonding ("LB"), small pitting ("SP"), junk damage ("LD"), erosion ("ER"), etc. With reference to FIG. 4 described further below, individual cutter grading values can be used to determine a cutter design grading value as described for block 420.

At block 318, the device or system can assign a primary characteristic and a secondary characteristic based on the weights used by the classification scheme. In some embodiments, the device or system can provide one or more primary and secondary characteristics to further characterize an identified cutter based on the weights used to determine the cutter value.

For example, a first set of nodes of a classification scheme can correspond with a characteristic related to cutter chipping, and a second set of nodes of a classification scheme can correspond with a characteristic related to surface wearing. In response to the nodes corresponding with erosion having the highest quantitative effect in determining a grading value and the nodes corresponding with a worn bit having a second highest quantitative effect in determining the grading value, the device or system can set "ER" as the primary characteristic and "WT" as the secondary characteristic.

At block 320, the device or system can fit a boundary of the cutter ("surface boundary") to the surface of each cutter on a bit based on the respective cutter's surface image. In some embodiments, the cutter surface image can be the same image as the drill bit image described above, or a region thereof. Alternatively, the cutter image can be another image of the cutter taken at a different angle than the drill bit image. In some embodiments, the surface boundary can be determined using an edge-detection method and fitted using one a fitting method such as an interpolation fitting method, a machine-learning fitting method, a function fitting method, etc. Alternatively, or in addition, a pre-determined surface boundary can be transformed to an angled boundary by applying a transformation based on the angle at which the image of the cutter surface is acquired. For example, if the pre-determined surface boundary is a circle and the image of the cutter surface is acquired at an angle of 45 degrees, the circle can be transformed into an ellipse using one or more rotation tensors based on a rotation of 45 degrees.

At block 324, the device or system can segment the cutter surface image based on the surface boundary and pixel values of the cutter surface image to determine a covered area of the cutter. The covered area of the cutter can be covered using various high-strength materials. For example, the covered area of the cutter be covered using a PDC material. In some embodiments, the device or system can segment the cutter surface image based on a comparison of brightness values of the pixels with a threshold brightness within the surface boundary. For example, a device or system can determine whether a pixel in a region bounded by the surface boundary has a brightness value greater than a threshold brightness, and determine that the portion of the surface corresponding with the pixel having a brightness value that exceeds the threshold is part of the covered area. Alternatively, or in addition, segmentation methods based on the surface boundary can be used. For example, the device or system can generate a set of pixel brightness values used to fit the surface boundary based on a set of known covered surface boundaries, and use the minimum brightness of this set of pixel brightness values as a brightness threshold.

At block 328, the device or system can generate a comparison value based on a covered area and the surface boundary. The comparison value is a metric of a cutter's physical condition and can be reported as a percentage of the cutter that is covered in a PDC material. Thus, in some embodiments, the comparison value can be generated based on a ratio of the cutter's covered area to the area contained by the surface boundary. For example, the covered area can correspond to 80 pixels and the area within the surface boundary can correspond to 100 pixels, setting the comparison value of the ratio to be 80%. Alternatively, or in addition, the comparison value can be fixed as the ratio between an area within a boundary covered by a particular material (e.g. PDC) and an area within the boundary not covered by the particular material. For example, the device or system can generate the comparison value by determining the extent of an uncovered region (by taking a difference between the covered surface and the area within the surface boundary), and then setting the comparison value to be equal to the ratio of the covered surface and the uncovered surface. With reference to FIG. 4 described further below, the comparison values and/or constituent values such as the areas of a covered surface can be used to determine one or more historical cutter performance metrics as described for block 420.

At block 332, the device or system can map context-specific cutter information, such as the comparison value and/or the grading value, to a specific cutter on the drill bit. Context-specific cutter information can include various results determined using the operations above, such as a cutter grading value, the cutter surface boundary, covered and/or uncovered areas on the surface of the cutter, etc. In some embodiments, the device or system can map context-specific cutter information to each bit cutter on a drill bit. Once the context-specific cutter information is mapped to a corresponding set of cutters, operations of the flowchart 300 can be considered complete.

FIG. 4 is a flowchart of operations to generate a bit design. FIG. 4 depicts a flowchart 400 of operations to generate a drill bit model comprising a bit design and a cutter design using a device or system that includes a processor. For example, operations of the flowchart 400 can be performed using a system similar to the computer system 1098 or computer device 1100 shown in FIGS. 10-11, respectively. Operations of the flowchart 400 start at block 404.

At block 404, the device or system analyzes a planned drilling operation to determine one or more design criteria. Analyzing a planned drilling operation can include determining planned drilling operation information such as a drilling depth, a borehole width(s), and/or an understanding of the material attributes of the material(s) subject to drilling. The material attributes can include rock hardness, toughness, elasticity, Poisson's ratio, etc. For example, the planned drilling operation information can include drilling a borehole having a radius of 0.25 meters into a limestone formation to a depth of 5000 meters, drilling a horizontal well borehole having a radius of 0.12 meters into a shale bed to a depth of 3000 meters, and/or drilling a borehole having a radius of 1.1 meters into ice to a depth of 300 meters. In addition, planned drilling operation information for a planned drilling operation also include a planned drilling location, a planned drilling time, and/or a planned drilling speed. For example, the system can generate design criteria based on a planned location of "shale-heavy region," a planned drilling time of "36 hours," and/or a planned drilling speed of "314.2 revolutions per minute." The system can determine design criteria by converting planned drilling operation information into one of a simulation parameter and/or a design criterion to be met during the simulation described further below for block 428.

The device or system can also use various methods such as cross-referencing data tables or entering quantitative planned drilling operation information into a well-planning system to determine one or more design criteria. For example, the system can enter the planned drilling operation information of drilling a borehole having a radius of 0.50 meters into a shale formation at a depth of 5000 meters into a well-planning system and receive performance criteria, such as "drill bit should have at least six blades and thirty cutters, each cutter capable of withstanding 500,000 revolutions at 9001 revolutions per minute with less than 95% covering loss, and reach the depth of 5000 meters within 4 hours." In some embodiments, the design criteria can be represented in natural language form. Alternatively, the design criteria can be represented as values in a data table corresponding to the quantitative or categorical aspects of a drilling operation.

At block 408, the device or system determines a bit design based on the design criteria and available bit information including cutter information, historical bit design performance data, and/or bit design data. Determining the bit design can include determining values for one or more bit design parameters such as bit circumference, number of blades, cutter design parameter, etc. For example, a bit design parameter can be a bit width, a cutter type, a cutter position, a combination of cutter types, etc. The system can determine the bit design based on the design criteria by filtering out possible bit designs that do not meet the design criteria. For example, the design criteria can include a design criterion that the drill bit must withstand a minimum torque 80,000 newton-meters and the device or system can filter out all possible bit designs that do not meet this minimum torque value.

In some embodiments, historical bit design performance can include historical bit design performance data such as statistical information based on the same or similar bits used in similar planned drilling operation. The system can use historical bit design performance data based on a categorical or statistical assessment of bits used and their expected performance lifetime in similar drilling operations. For example, the system can compare the performance of a "type 1" bit with a "type 2" bit when drilling through formations to a depth of 5000 meters and determine that a "type 2" bit has a longer expected performance life than the "type 1" bit. A bit performance life can be based on the amount of time required during the cumulative use of a drill bit and/or a cutter to reduce a covered area of the cutting surface by a threshold amount, wherein the covered area is the area of a cutter on the drill bit that is covered by a hard cutting material. In response, the system can determine a bit design based on the "type 2" bit, and/or increase the weight corresponding to a decision to determine a bit design for the "type 2" bit in a weighted-sum decision system or a machine-learning framework.

In some embodiments, the system can use a machine-learning framework trained on training data including training historical bit design performance metrics. For example, the system can generate a trained machine-learning framework by training the machine-learning framework using training historical bit design performance metric such as categorical or statistical assessments of bits used and their expected performance lifetime as inputs during the training. The machine-learning framework can use one or more pre-determined cutter types, cutter positions, and/or other training bit design parameters as targets in the corresponding objective function(s) during the training, wherein each of the training bit design parameters is associated with one or more of the training historical bit design performance metrics. For example, the machine-learning framework can be trained based on training data comprising a set of expected performance lifetime values and a set of drilling efficiency values as inputs during a training operation of a machine-learning framework and an objective function using one or more known cutter types and/or their corresponding cutter positions as target values during the training of the machine-learning framework. In some embodiments, the machine-learning framework can be the same machine-learning framework described above for the flowchart 300 of FIG. 3.

In some embodiments, bit design data can include a data table of bit designs and their corresponding known limitations and features. In some embodiments, a data table of bit designs can include a recommended performance range and/or maximum performance range for the bit designs listed in the data table. The system can select and/or weight more heavily bit designs in the data table that have a performance range closest to one or more design criteria. For example, a design criterion can be that the drill bit have an expected operational lifespan of 51 hours. In response, the system can select a bit design having an expected operational lifespan that is greater than 51 hours to reduce the likelihood of bit failure. The system can also select a bit design having an expected operational lifespan that is not greater than 56.1 hours (that is, 10% above 51 hours) to reduce the unnecessary use of longer-life bit designs.

In some embodiments, the cutter information can be determined as described below for block 420. Alternatively, or in addition, the cutter information can include pre-established cutter information provided by manufacturer specifications or material properties. For example, the cutter information can include a range of safe drilling speeds, a recommended performance life, etc. The system can use this cutter information to determine bit design by filtering for bit designs that are compatible with the cutters determined below at block 420 and/or cutters that are otherwise selected based on the design criteria.

At block 420, the system determines one or more cutter designs to be mounted on the bit design based on cutter information including one or more historical cutter performance metrics and/or grading values corresponding to the possible cutter. In some embodiments, the historical cutter performance metrics can be determined based on one or more comparison values based on a covered region as described for block 328.

For example, the system can assign a mean or median comparison value as a historical cutter performance metric, wherein the mean or median comparison value is the mean or median average of the comparison values of fifteen cutters that have been used in drilling operations similar to the planned drilling operation described in block 404, and wherein each of the fifteen cutters share the same cutter design. In addition, the system can further refine the historical cutter performance metric with a specific position on the bit design. For example, the historical cutter performance metric can be equal to a variance or standard deviation of the areas of the covered regions for nine cutters at a specific shoulder position on a bit design after a 10 hour drilling operation.

In addition, with reference to FIG. 3, the grading value assigned to a cutter design can be based one or more grading values as determined in block 316 and assigned in block 332. Each grading value for a cutter design can be based on a median average, mode average, mean average, and/or a worst-case grading value for a set of cutter grading values. For example, the grading value for a cutter design at a nose position can be "A" in response to the majority of cutters at that nose position having the grading value of "A." Alternatively, the grading value for a cutter design can be based on a worst-case scenario and be set to "D" in response to one of the cutters having the cutter design having a grading value of "D."

The system can determine the cutter design by selecting the cutter associated with a target historical cutter performance metric, a greatest historical cutter performance metric, and/or a least historical cutter performance metric. For example, the system can determine the cutter design by selecting the cutter design associated with retaining a target average percentage of covered region after a total drilling time of 50 hours. Alternatively, the system can determine the cutter design by selecting the cutter design corresponding with at least one of a target cutter grading value or a grading value corresponding with the greatest durability after a drilling operation. For example, the system can determine the cutter design by selecting the cutter design having a grading value of "A," which corresponds with the greatest durability. Alternatively, the system can determine the cutter design using at least one of a neural network, a weighted sum, or a rule-based decision system based on the historical cutter performance metric and the cutter design. For example, the system can determine cutter design based on which cutter design has a grading value of "A" and is associated with retaining the greatest median percentage of covered region after 30 hours of drilling time. In some embodiments, the system can determine a plurality of different cutter designs should be mounted on a bit design based on the positions for the cutter designs on the bit design. For example, the system can determine that a "Type AFK" cutter should be mounted on a nose position of the bit design and that a "Type XOX" cutter should be mounted on a cone position of the bit design.

At block 424, the system generates a drill bit model based on the bit design and the one or more cutter designs. The system can combine the bit design with the cutter designs to generate the drill bit model. For example, after determining that the bit design is a 6-blade bit design with 48 cutter positions and that the cutters for the bit design include "Type OOO" cutters and "Type BBL" cutters, the system can generate a drill bit model having the 6-blade bit design with each of the 48 cutter positions occupied by either "Type OOO" or "Type BBL" cutters. In addition, the system can include additional features to the drill bit model, such as a compatibility port for specific bottom hole assembly system or modules for other sensing behaviors.

At block 428, the system simulates a planned drilling operation based on the drill bit model and/or one or more design criteria. The system can simulate the planned drilling operation using various simulation methods, such as finite element, finite volume, etc. For example, the system can simulate the planned drilling operation using a finite element simulator comprising a virtualized drill bit based on the drill bit model and virtualized formation rock.

In addition, relevant design criteria can be used to set up the parameters of the simulation. For example, the design criteria that the planned drilling operation is to take place in a shale-heavy region can result in setting the material properties of the formation in the simulation to be similar or equal to shale material properties. Alternatively, the system can generate and transmit instructions to perform a physical experiment to drill a manufactured or extracted formation sample using a physical drill bit that manufactured according to the drill bit model.

At block 436, the system determines whether the drill bit model meets the one or more design criteria based on the simulation. After evaluating one or more results of the simulation described for block 428, the system can determine whether the one or more design criteria have been met. For example, the system can have a design criterion that a well depth of 1000 meters is reached within 3 hours of drilling. The simulation result can suggest that the well depth of 1050 meters is reached after 3 hours of drilling using a drill bit using the selected drill bit model. In response, the system can determine that the drill bit model does meet the design criterion. If the system determines that the drill bit model meets the design criteria, the system can proceed to block 440. Otherwise, the system can return to block 408 to update the drill bit design and/or the bit cutter design and proceed to block 420.

At block 440, the system sets the drill bit model as a selected drill bit model. The system can set the drill bit model as the selected drill bit model in response to the drill bit model meeting the one or more design criteria. In some embodiments, setting the drill bit model as the selected drill bit model can include an operation to visually indicate that the drill bit model is selected. Alternatively, or in addition, the system can set a value corresponding to the drill bit model, assign a reference indicator to the drill bit model, or associate a tag to the drill bit model stored in a memory system to indicate that the drill bit model is the selected drill bit model. The operations of the flowchart 440 can then be considered as completed.

Example Data

Figure 5:
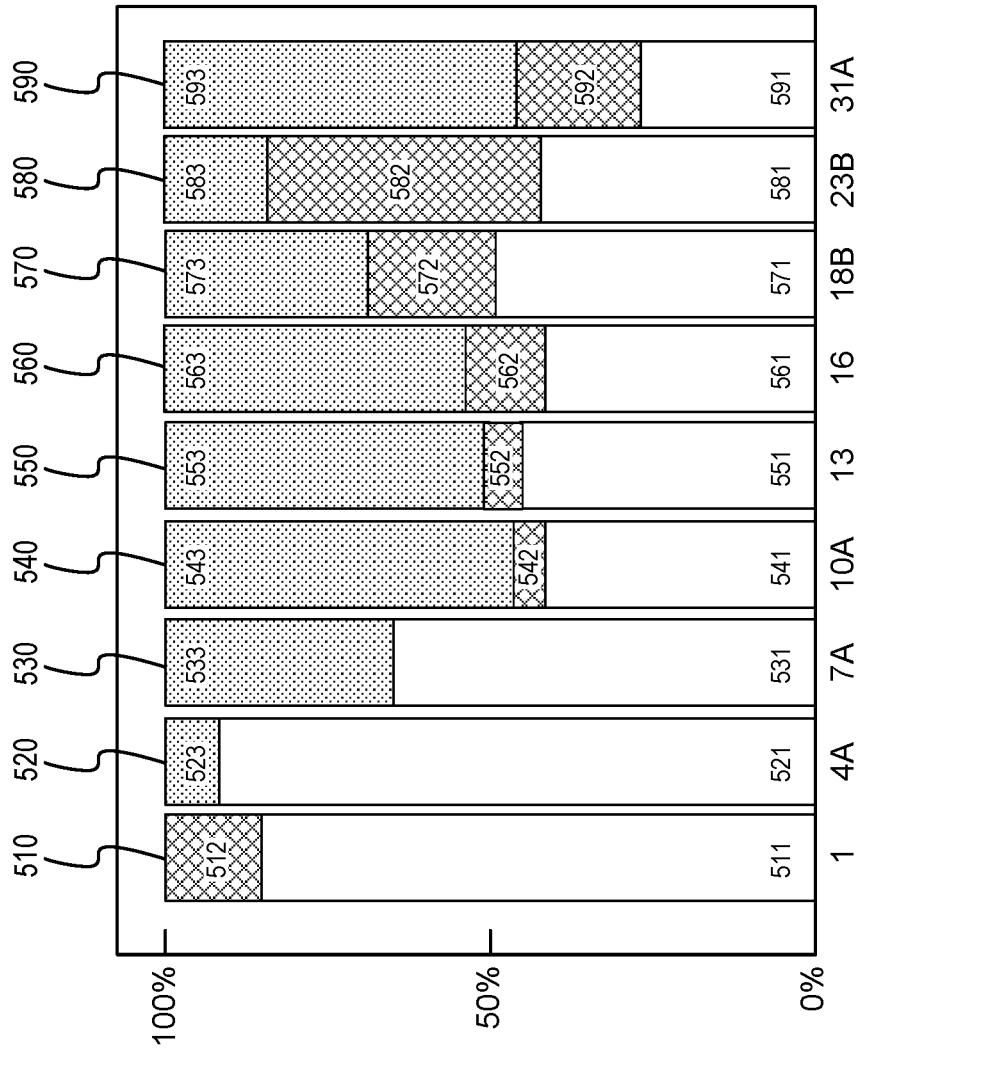
FIG. 5 is a bar plot visualizing historical performance metrics.

FIG. 5 is a bar plot visualizing historical performance metrics. The bar plot 500 includes a set of bars 510, 520, 530, 540, 550, 560, 570, 580, and 590. Each of the set of bars represent aggregate historical performance metrics corresponding to cutters at a position having cutter position identifiers of "1," "4A," "7A," "10A," "13," "16," "18B," "23B," and "31A." In this case, each of the cross-hatched regions 512, 542, 552, 562, 572, 582, and 592 represents a percentage of cutters at their respective cutter positions that had a comparison value less than 80%—and as a result, were replaced. For example, the cross-hatched region 512 represents that approximately 15% of the cutters at position "1" on a drill bit had a comparison value less than 80% and were replaced.

In addition, each of the dotted regions 523, 533, 543, 553, 563, 573, 583, and 593 represent a percentage of cutters at their respective cutter positions that had a comparison value greater than 80% and less than 98%—and as a result, were rotated. For example, the dotted region 583 represents that approximately 15% of the cutters at position "23B" on a drill bit had a comparison value greater than 80% and less than 98% and were rotated in response. With reference to FIG. 4, above, historical performance metrics such as those represented by the bar plot 500 can be used to determine cutter designs as described for block 420.

Example Image Acquisition and Cutter
Identification System

Figure 6:
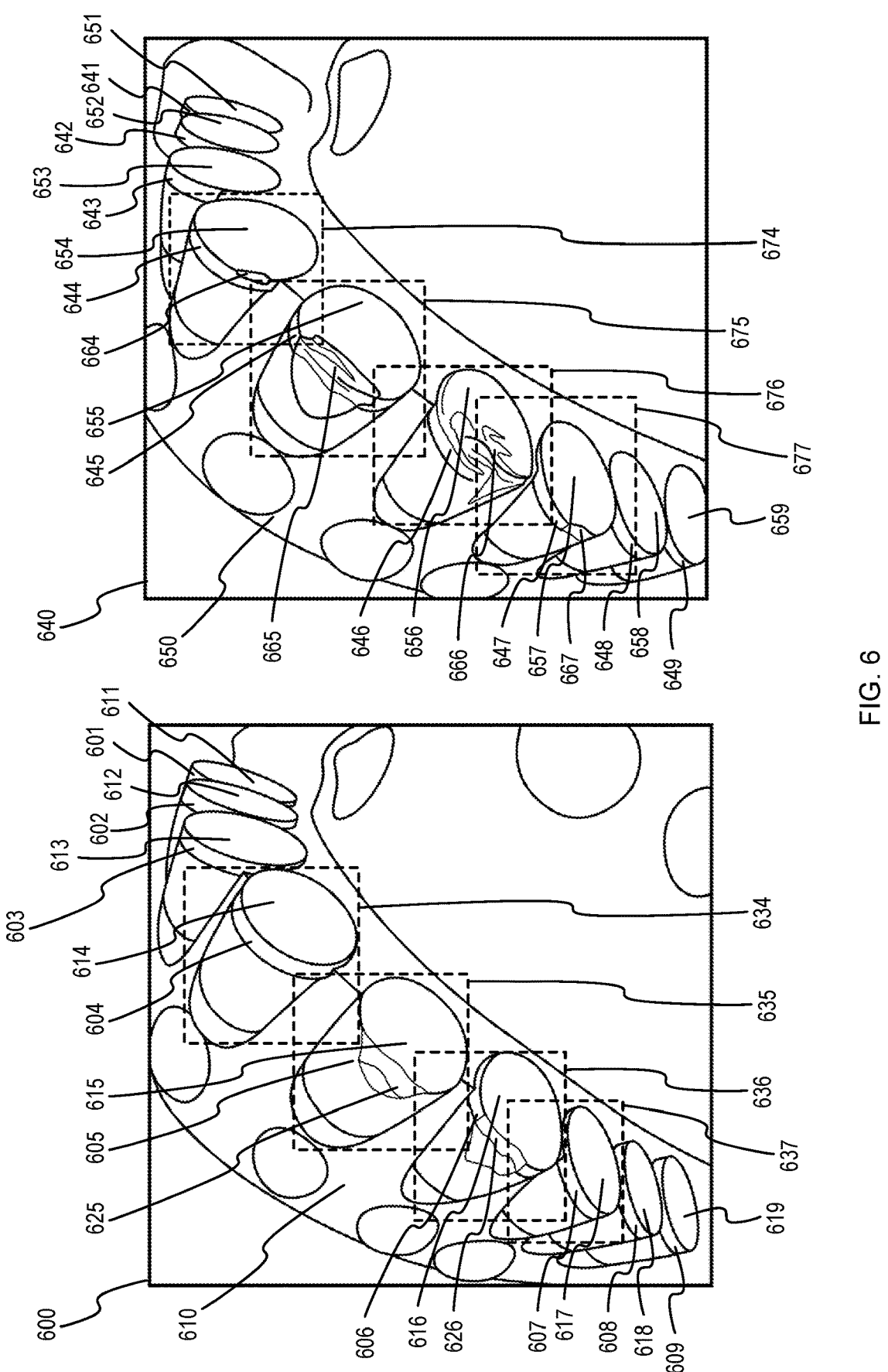
FIG. 6 is a set of isometric views of identified cutters on different blades of a drill bit.

FIG. 6 is a set of isometric views of identified cutters on different blades of a drill bit. With reference to FIG. 2, each of the first box 600 and the second box 640 include an isometric view of a drill bit 201. The first box 600 includes a view of first blade 610 with bit cutters 601-609, wherein each of the bit cutters 601-609 have a corresponding cutter surface within the set of cutter surfaces 611-619. One or more of the bit cutters 601-609 can include physical degradation, such as having their PDC layer worn off at their respective cutter surface. For example, the bit cutter 605 show a degraded portion 625 at the cutter surface 615, and the bit cutter 606 shows a degraded portion 626 at the cutter surface 616.

With further reference to FIG. 3, using operations described for block 308, a device or system can identify one or more of the bit cutters 601-609. The device or system can identify a cutter by generating an identifier value for a cutter and assigning a bounded region corresponding to the cutter. For example, a device or system can identify each of the bit cutters 614-617 by generating a set of identifier values and mapping each of the set of bounded regions 634-637 to each of the respective identifier values.

The second box 640 includes a view of second blade 650 with bit cutters 641-649, wherein each of the bit cutters 641-649 have a corresponding cutter surface within the set of cutter surfaces 651-659. One or more of the bit cutters 641-649 can include physical degradation, such as having their PDC layer worn off at their respective cutter surface. For example, the bit cutter 645 shows a degraded portion 665 at the cutter surface 655, and the bit cutter 646 shows a degraded portion 666 at the cutter surface 656.

With further reference to FIG. 3, using operations described for block 308, a device or system can identify one or more of the bit cutters 641-649. The device or system can identify a cutter by generating an identifier value for a cutter and assigning a bounded region corresponding to the cutter. For example, the device or system can identify each of the bit cutters 644-647 by generating a set of identifier values and mapping each of a set of bounded regions 674-677 to each of the respective identifier values.

Example Analysis System Operations

Figure 7:
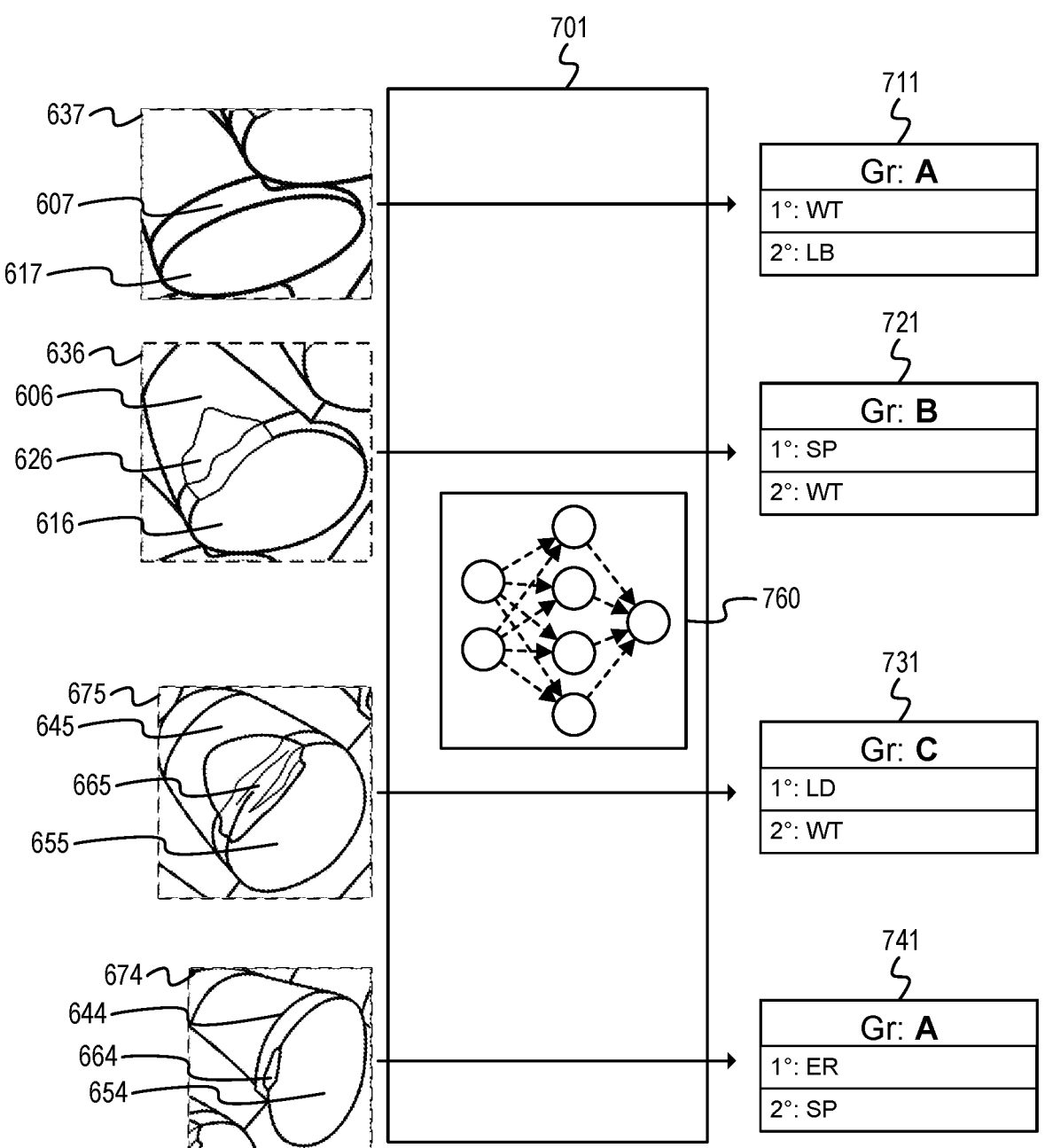
FIG. 7 includes a set of example grading values and characteristics of identified cutters shown in FIG. 6 that can be mapped to the cutters of the drill bit.

FIG. 7 includes a set of example grading values and characteristics of identified cutters shown in FIG. 6 that can be mapped to the cutters of the drill bit. Each of the bounded regions 636, 637, 674 and 675 represents an image of one cutter from the identified set of bit cutters 606, 607, 644 and 645 and can be evaluated using a grading system 701. The bit cutter 606 includes a cutter surface 616 and a degraded portion 626. The bit cutter 607 includes a cutter surface 617. The bit cutter 644 includes a cutter surface 654 and a degraded portion 664. The bit cutter 645 includes a cutter surface 655 and a degraded portion 665.

The grading system 701 can comprise a neural network 760 (further described in FIG. 8 below), which may in turn be realized as various program code packages trained to grade cutters. Alternatively, or in addition, the grading system 701 can include a machine-learning framework comprising one or more neural networks such as a feed forward neural network, a deep recurring neural network, etc. The grading system 701 can be used to classify each of the bit cutters 606, 607, 644 and 645 with the grading results 711, 721, 731, 741. The grading result 711 includes a grading value that may comprise a letter grade and/or a numerical grade. For example, the grading result 711 can include a result of "A." The grading result 711 also includes a primary attribute of "WT" in response to a determination that the nodes of the neural network 760 (or other portion of a machine-learning framework) corresponding with worn cutters had the greatest quantitative effect in determining the grading value, and the classifier result using these nodes is "worn teeth." In addition, the grading result 711 includes a secondary attribute "LB" in response to a determination that the nodes corresponding with low surface bonding had the second greatest quantitative effect in determining the grading value, and the classifier result using these nodes is "low bonding."

The grading result 721 includes a grading value "B." The grading result 721 also includes a primary attribute "SP" in response to a determination that the nodes corresponding with pitting had the greatest quantitative effect in determining the grading value and the classifier result using these nodes is "small pitting." In addition, the grading result 721 also includes a secondary attribute of "WT" in response to a determination that the nodes corresponding with worn cutters had the greatest quantitative effect in determining the grading value grading value and the classifier result using these nodes is "worn teeth."

The grading result 731 includes a grading value "C." The grading result 731 also includes a primary attribute of "LD" in response to a determination that the nodes corresponding with cutter integrity had the greatest quantitative effect in determining the grading value and the classifier result using these nodes is "junk damage." In addition, the grading result 731 includes a secondary attribute "WT" in response to a determination that the nodes corresponding with worn cutters had the greatest quantitative effect in determining the grading value and the classifier result using these nodes is "worn teeth."

The grading result 741 includes a grading value "A." The grading result 741 also includes a primary attribute "ER" in response to a determination that the nodes corresponding with cutter surface erosion had the greatest quantitative effect in determining the grading value and the classifier result using these nodes is "erosion." In addition, the grading result 741 also includes a secondary characteristic of "SP" in response to a determination that the nodes corresponding with cutter integrity had the second greatest quantitative effect in determining the grading value and the classifier result using these nodes is "small pitting."

With reference to FIG. 3, each of the grading results 711, 721, 731 and 741 can be mapped to a bit cutter in a 3D model using operations described for block 332. For example, a device or system can map the grading result 711 to an identifier value corresponding to the bit cutter 607 in a 3D model of a drill bit. The device or system can also map the grading result 721 to an identifier value corresponding to the bit cutter 606 in the 3D model. In addition, the device or system can also map the grading result 731 to an identifier value corresponding to the bit cutter 645 in the 3D model. Furthermore, the device or system can also map the grading result 741 to an identifier value corresponding to the bit cutter 644 in the 3D model.

FIG. 8 is an example neural network used to identify a cutter, and determine grading values and/or characteristics of the identified cutter. With reference to FIG. 7 above, the grading system 701 can include the neural network 800. The neural network 800 includes an input layer 801, a hidden layer 802, and an output layer 803. The input layer includes a first input node 811 and second input node 812. The first input node 811 and second input node 812 can represent values such as a pixel brightness, pixel brightness variance within a preset region size, average difference from pixel brightness values of nearest neighbors, etc. While the input layer depicts two input nodes, various other numbers of inputs such as 10 input nodes, 9999 input nodes, etc. can be used.

The hidden layer 802 includes the hidden nodes 831-834, wherein each of the input nodes 811-812 can be connected to the hidden nodes 831-834 with forward connections represented by lines 821-828. The lines 821-824 represent forward connections from the first input node 811 to each of the hidden nodes 831-834. The lines 825-828 represent forward connections from the second input node 812 to each of the hidden nodes 831-834. Each of the connections represented by the lines 821-828 can have an associated weight value that the device or system can apply when sending a node output as an input to another node.

For example, the connection represented by the line 821 can have a weight of 0.25, the connection represented by the line 822 can have a weight of 0.5, the connection represented by the line 823 can have a weight of 0.85, and the connection represented by the line 824 can have a weight 0.99. Each of the nodes of the hidden layer can apply an activation function, such as the sigmoidal function shown in Equation 1, to its corresponding input values and sum them. In this case, x represents an output value from a previous node to a receiving node, w represents a corresponding weight value, and f(x) is an output value:

$$f(x) = \frac{1}{1 + e^{-w*x}} \tag{1}$$

The classification model can be or can otherwise include the set of weights associated with some or all of the connections represented by the lines 821-828 and/or values corresponding to the hidden nodes 831-834. For example, the classification model may comprise the set [conn1: 0.25, conn2: 0.5, conn3: 0.65, conn4: 0.99, conn6: 0.15, conn7: 0.91]. In some embodiments, the hidden nodes 831-834 can use other functions such as hyperbolic functions, step functions, etc. While the hidden layer 802 depicts a single node layer, the hidden layer 802 can include multiple layers of nodes. Furthermore, while the hidden layer 802 is depicted as having four nodes, the hidden layer 802 can include any number of nodes, such as 1000 nodes, 9000 nodes, 1 million nodes, etc.

The output layer 803 includes the output nodes 851-852, wherein the hidden nodes 831-834 can be connected to the output nodes 851 with forward connections represented by lines 841-844. The lines 841-844 represent forward connections from each of the hidden nodes 831-834 to the output node 851. Each of the connections represented by the lines 841-844 can have an associated weight value that the device or system can multiply when sending a node output as an input to another node. For example, the connection represented by the line 841 can have a weight of 0.35, the connection represented by the line 842 can have a weight of 0.15, the connection represented by the line 843 can have a weight of 0.83, and the connection represented by the line 844 can have a weight 0.91. The output node can apply an activation function to its corresponding input values and sum them, perhaps using the same Equation 1. Alternatively, the activation function of the output node can be one of various other functions such as hyperbolic functions, step functions, etc.

The output value can then be converted to one or more identified cutter regions, grading results, primary characteristics, and/or secondary characteristics based on a data table. For example, the output value 0.25 can be converted to the grading result of "A."

In some embodiments, a neural network similar to the neural network 800 can also be used to determine whether a selected image of the drill bit includes an image of a cutter. For example, as described for block 308 in FIG. 3, the inputs for input nodes similar to nodes 811-812 can be brightness values based on sections of an image of a drill bit. An output node similar to the output node 851 can be used to generate a cutter probability value, wherein a greater cutter probability value implies a greater probability that a given images includes a cutter. As described for block 308, the identification of a cutter can be based on the cutter probability value determined by the neural network similar to the neural network 800.

Figure 9:
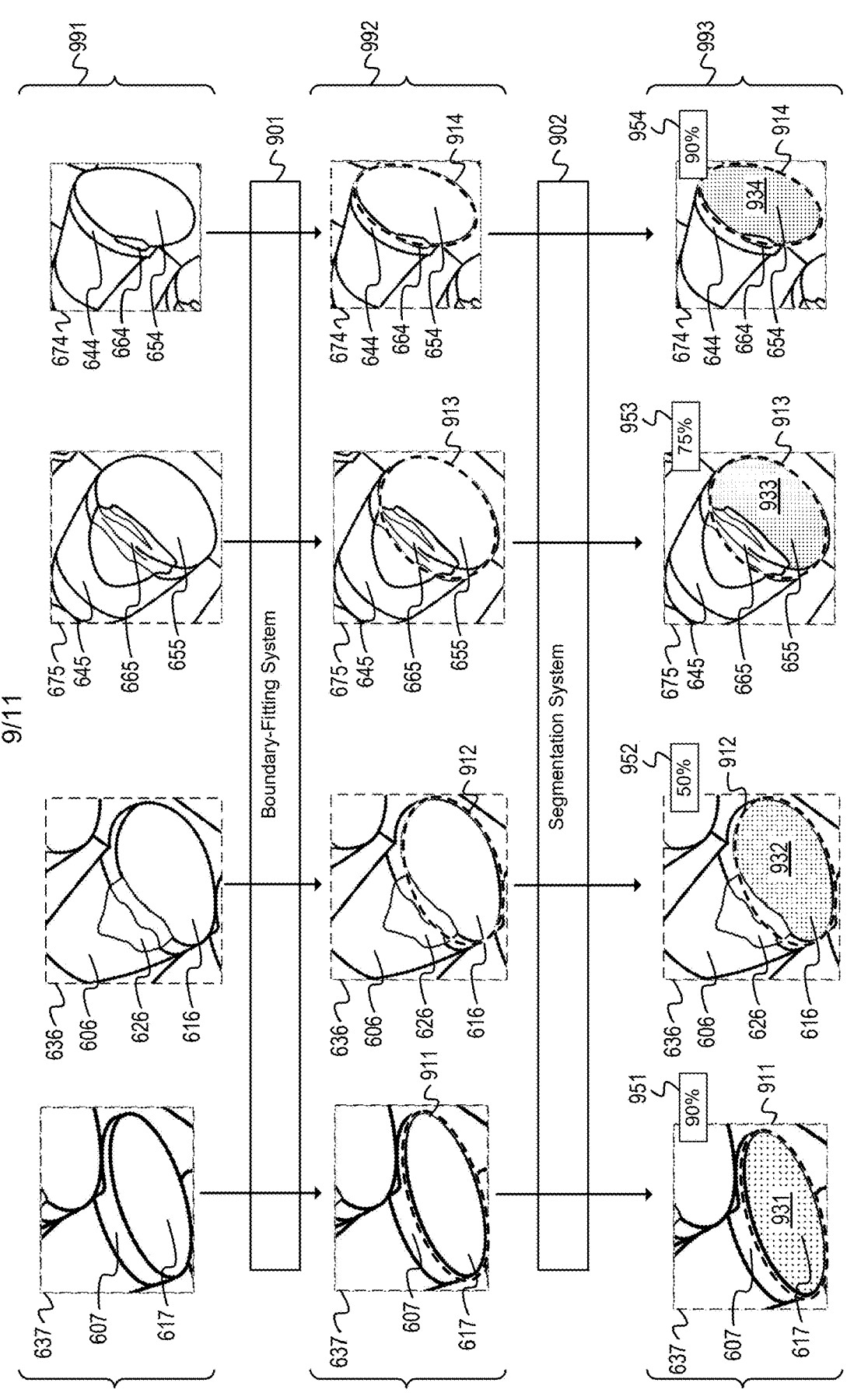
FIG. 9 is set of example results of a boundary-fitting system and segmentation system applied to a set of images of identified cutters shown in FIG. 6.

FIG. 9 is set of example results of a boundary-fitting system and segmentation system applied to a set of images of identified cutters shown in FIG. 6. A boundary-fitting system 901 can fit surface boundaries to each of the identified set of bit cutters 606, 607, 644 and 645 in the pre-processing set 991 based on images of the bounded regions 636, 637, 674 and 675.

The bit cutter 606 includes a cutter surface 616 and a degraded portion 626. The bit cutter 607 includes a cutter surface 617. The bit cutter 644 includes a cutter surface 654 and a degraded portion 664. The bit cutter 645 includes a cutter surface 655 and a degraded portion 665.

The boundary-fitting system 901 can generate the surface boundaries 911-914 shown in the post-fitting set 992, each of which are superimposed on their corresponding set of bit cutters 606, 607, 644 and 645. In some embodiments, the surface boundaries 911-914 can be ellipses. In some embodiments, surface boundaries can be other shapes such as circles, quadrilaterals, triangles, etc. The boundary-fitting system 901 can use various fitting methods such as an interpolation fitting method, a machine-learning fitting method, a function fitting method, etc.

For example, the boundary-fitting system 901 can generate the surface boundaries 911-914 for the cutter surfaces 617, 616, 665, and 664, respectively by analyzing images of the bounded regions 637, 636, 675, and 674, respectively, using a function fitting method. In some embodiments, the With reference to FIG. 3, the system can perform operations similar to or the same as those described for block 328 to generate comparison values 951-954. The system 902 can generate comparison values 951-954 for each of the bit cutters 606, 607, 644 and 645. As noted previously, a comparison value is a metric of the cutter's physical condition and can be reported as a percentage of the cutter that is covered in a PDC material. For example, the comparison value can be a fraction, and comparison value corresponding with the bit cutter 607 can have a numerator equal to the area of the shaded region 931 and a denominator equal to the area in the surface boundary 911.

Results such as the comparison values 951-954, the areas bounded by the surface boundaries 911-914, etc. may all comprise context-specific cutter information. With further reference to FIG. 3, this context-specific cutter information can be mapped to its corresponding bit cutter in a 3D model using operations described for block 332, wherein the data structure can be represented in Table 1 below:

TABLE 1

| Identifier Value | Grading Value | Primary Characteristic | Secondary Characteristic | Coated Region (centimeters^2) | Comparison Value-Covered Ratio |
|---|---|---|---|---|---|
| 1-04 | A | WT | LB | 1.8 | 90% |
| 1-05 | B | SP | WT | 1.0 | 50% |
| 2-03 | C | LD | WT | 1.5 | 75% |
| 2-04 | A | ER | SP | 1.8 | 90% | boundary-fitting system 901 may comprise a software program module that operates to generate the boundaries.

In addition, a segmentation system 902 can apply a segmentation operation similar to or the same as that described for block 324 to the set of cutter surfaces 616-617 and 654-655 in the post-fitting set 992 to segment a surface into covered regions 931-934 shown the post-segmented set 993. For example, the covered area of the cutter surfaces 616-617 and 654-655 can be darker in an image than an uncovered region of the surfaces in the same image. By comparing the pixel brightness value of each pixel in the images of the cutter surfaces 616-617 and 654-655 within their respective surface boundaries, the system 902 can determine which regions of the cutter are covered and uncovered, wherein an uncovered portion of the cutter is designated to be a degraded portion of the cutter.

For example, the segmentation system 902 can compare the pixel brightness of each pixel in the surface boundary 911 within an image of the bounded region 637 to a brightness threshold in order to determine the extent of the covered region 931 Similarly, the segmentation system 902 can compare the pixel brightness of each pixel in the surface boundary 912 within an image of the bounded region 636 to a brightness threshold in order to determine the extent of the covered region 932 and make it distinct from the degraded portion 626. In addition, the segmentation system 902 can compare the pixel brightness of each pixel in the surface boundary 913 within an image of the bounded region 675 to a brightness threshold in order to determine the extent of the covered region 933 and make it distinct from the degraded portion 665. Furthermore, the segmentation system 902 can compare the pixel brightness of each pixel in the surface boundary 914 within an image of the bounded region 674 to a brightness threshold in order to determine the extent of the covered region 934 and make it distinct from the degraded portion 664. In some embodiments, the segmentation system 902 may comprise a software program module that operates to perform the segmentation operation described above.

For example, with reference to Table 1 above, a system can map the comparison value 951 to an identifier value "1-04" corresponding to the bit cutter 607 in a 3D model of a drill bit. The system can also map an area bounded by the surface boundary 912 to an identifier value "1-05" corresponding to the bit cutter 606 in the 3D model. In addition, the system can also map an area of the covered region 933 to an identifier value "2-03" corresponding to the bit cutter 445 in the 3D model. Furthermore, the system 902 can also map an area of the covered region 934 to an identifier value "2-04" corresponding to the bit cutter 644 in the 3D model. In some embodiments, additional characteristics, values, categories, etc. can be mapped to identifier values corresponding to a cutter on a drill bit.

Example Onshore Drilling Platform

Figure 10:
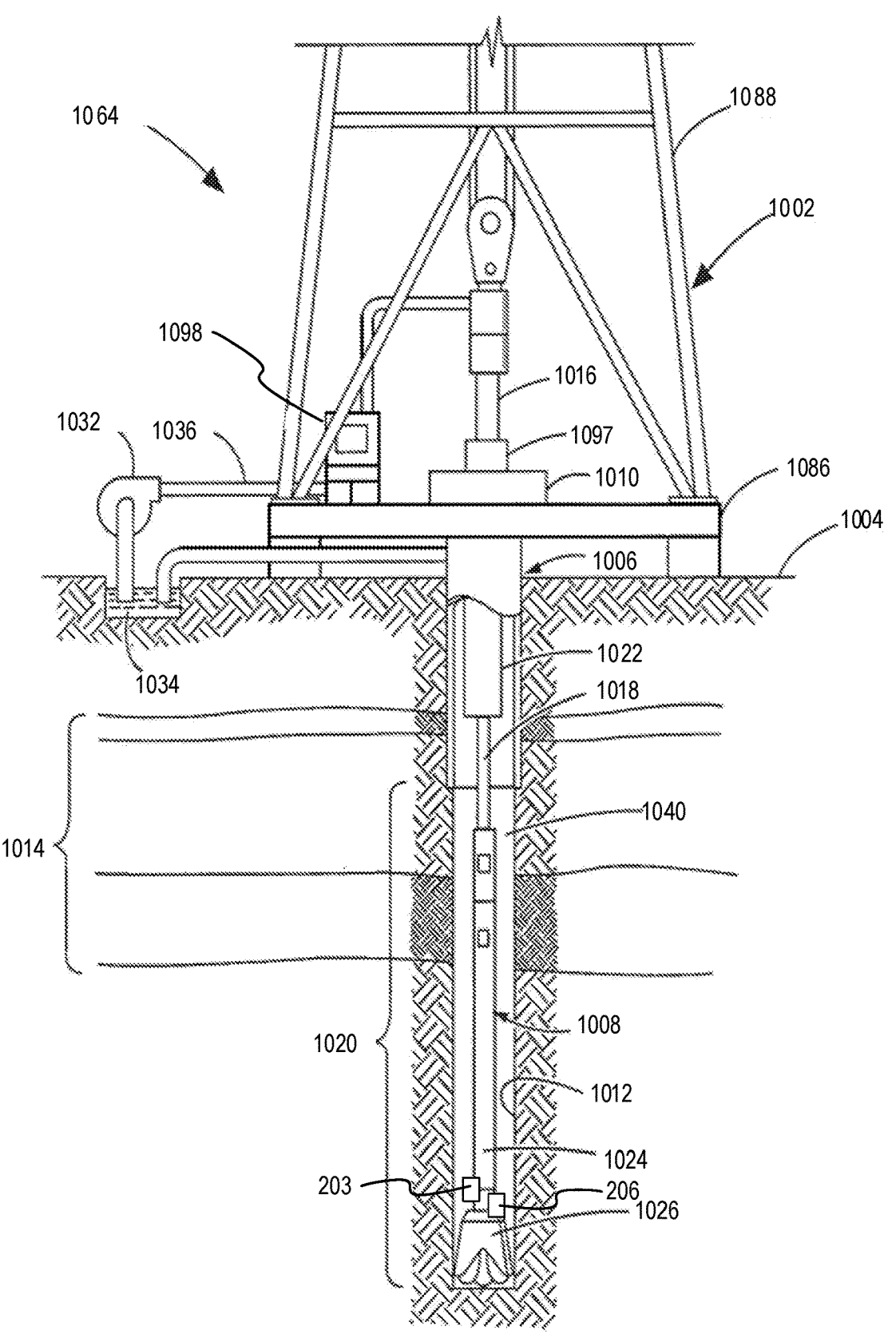
FIG. 10 is an elevation view of an onshore platform that includes a drill bit in a borehole.

FIG. 10 is an elevation view of an onshore platform that includes a drill bit in a borehole. FIG. 10 shows a system 1064 that includes a portion of a drilling rig 1002 located at the surface 1004 of a well 1006. Drilling of oil and gas wells is commonly carried out using a string of drill pipes connected together so as to form a drilling string 1008 that is lowered through a rotary table 1010 into a borehole 1012. Here a drilling platform 1086 is equipped with a derrick 1088 that supports a hoist.

The drilling rig 1002 may thus provide support for the drill string 1008. The drill string 1008 may operate to rotate the rotary table 1010 for drilling the borehole 1012 through subsurface formations 1014. The drill string 1008 may include a Kelly 1016, drill pipe 1018, and a bottom hole assembly 1020, perhaps located at the lower portion of the drill pipe 1018.

The bottom hole assembly 1020 may include drill collars 1022, a down hole tool 1024, and a drill bit 1026 that includes a set of cutters. The drill bit 1026 may operate to create a borehole 1012 by penetrating the surface 1004 and subsurface formations 1014. The down hole tool 1024 may comprise any of a number of different types of tools including measurement while drilling (MWD) tools, logging while drilling (LWD) tools, and others.

During drilling operations, the drill string 1008 (perhaps including the Kelly 1016, the drill pipe 1018, and the bottom hole assembly 1020) may be rotated by the rotary table 1010. In addition to, or alternatively, the bottom hole assembly 1020 may also be rotated by a motor such as a mud motor that is located down hole. The drill collars 1022 may be used to add weight to the drill bit 1026. The drill collars 1022 may also operate to stiffen the bottom hole assembly 1020, allowing the bottom hole assembly 1020 to transfer the added weight to the drill bit 1026, and in turn, to assist the drill bit 1026 in penetrating the surface 1004 and subsurface formations 1014. With reference to FIG. 3 and FIG. 4 above, the computer system 1098 can perform some or all of the operations described above in the flowcharts 300 and 400 (including any and all operations described with respect to FIG. 7 and FIG. 8) to generate a drill bit design used to produce the drill bit 1026. In some embodiments, the cameras 203, 206 may be located downhole, proximate to the drill bit 1026.

During drilling operations, a mud pump 1032 may pump drilling fluid (sometimes known by those of ordinary skill in the art as "drilling mud") from a mud pit 1034 through a hose 1036 into the drill pipe 1018 and down to the drill bit 1026. The drilling fluid can flow out from the drill bit 1026 and be returned to the surface 1004 through an annular area 1040 between the drill pipe 1018 and the sides of the borehole 1012. The drilling fluid may then be returned to the mud pit 1034, where such fluid is filtered. In some embodiments, the drilling fluid can be used to cool the drill bit 1026, as well as to provide lubrication for the drill bit 1026 during drilling operations. Additionally, the drilling fluid may be used to remove subsurface formation 1014 cuttings created by operating the drill bit 1026.

Example Computer

Figure 11:
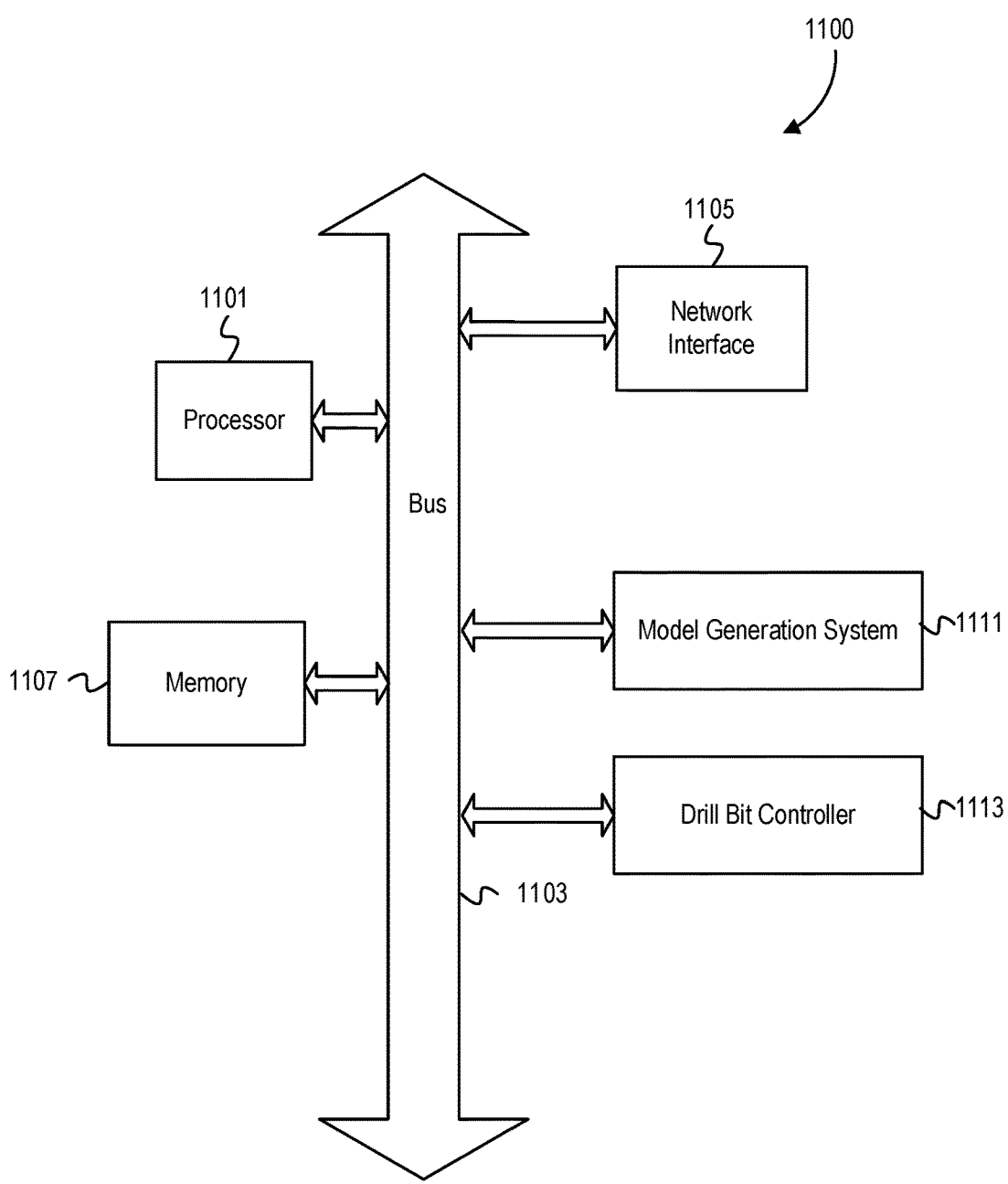
FIG. 11 is a schematic diagram of an example computer device.

FIG. 11 is a schematic diagram of an example computer device. A computer device 1100 includes a processor 1101 (possibly including multiple processors, multiple cores, multiple nodes, and/or implementing multi-threading, etc.). The computer device 1100 includes a memory 1107. The memory 1107 may comprise system memory. Example system memory can include one or more of cache, static random access memory (RAM), dynamic RAM, zero capacitor RAM, Twin Transistor RAM, enhanced dynamic RAM, extended data output RAM, double data rate RAM, electrically erasable programmable read-only memory, nano RAM, resistive RAM, "silicon-oxide-nitride-oxide-silicon memory, parameter RAM, etc., and/or any one or more of the above already described possible realizations of machine-readable media. The computer device 1100 also includes a bus 1103. The bus 1103 can include buses such as Peripheral Component Interconnect (PCI), Industry Standard Architecture (ISA), PCI-Express, HyperTransport® bus, InfiniBand® bus, NuBus, etc. The computer device 1100 can also include a network interface 1105 (e.g., a Fiber Channel interface, an Ethernet interface, an internet small computer system interface, synchronous optical networking interface, wireless interface, etc.).

The computer device 1100 can include a model generation system 1111. The model generation system 1111 can perform one or more operations to generate a drill bit model as described above. For example, the model generation system 1111 can identify cutters on a drill bit image and determine design criteria based on a planned drilling operation. Additionally, the model generation system 1111 can determine one or more cutter designs based on one or more historical cutter performance metrics. With reference to FIG. 7 and FIG. 9 above, the model generation system 1111 may further comprise the grading system 701, boundary-fitting system 901, and segmentation system 902.

The computer device 1100 can include a drill bit controller 1113. The drill bit controller 1113 can perform one or more operations to control a drill bit as described above. For example, the drill bit controller 1113 can lower a drill bit during a drilling operation. Additionally, the drill bit controller 1113 can activate a drill bit during the drilling operation. In addition, although illustrated together, the computer device 1100 can include the drill bit controller 1113 without the model generation system 1111 or include the model generation system 1111 without the drill bit controller 1113. The model generation system 1111 may be similar to or identical to the computer system 1098, shown in FIG. 10.

Any one of the previously described functionalities can be partially (or entirely) implemented in hardware and/or on the processor 1101. For example, the functionality can be implemented with an application specific integrated circuit, in logic implemented in the processor 1101, in a co-processor on a peripheral device or card, etc. Further, realizations can include fewer or additional components not illustrated in FIG. 11 (e.g., video cards, audio cards, additional network interfaces, peripheral devices, etc.). The processor 1101 and the network interface 1105 are coupled to the bus 1103. Although illustrated as being coupled to the bus 1103, the memory 1107 can be coupled to the processor 1101.

As will be appreciated, aspects of the disclosure can be embodied as a system, method or program code/instructions stored in one or more machine-readable media. Accordingly, aspects can take the form of hardware, software (including firmware, resident software, micro-code, etc.), or a combination of software and hardware aspects that can all generally be referred to herein as a "circuit" or "system." The functionality presented as individual units in the example illustrations can be organized differently in accordance with any one of platform (operating system and/or hardware), application ecosystem, interfaces, programmer preferences, programming language, administrator preferences, etc.

Any combination of one or more machine readable medium(s) can be utilized. The machine-readable medium can be a machine-readable signal medium or a machine-readable storage medium. A machine-readable storage medium can be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium can be any tangible medium that can contain, or store a program for use by or in connection with an instruction execution system, apparatus, or device. A machine-readable storage medium is not a machine-readable signal medium.

A machine-readable signal medium can include a propagated data signal with machine readable program code embodied therein, for example, in baseband or as part of a carrier wave. Such a propagated signal can take any of a variety of forms, including, but not limited to, electromagnetic, optical, or any suitable combination thereof. A machine-readable signal medium can be any machine readable medium that is not a machine-readable storage medium and that can communicate, propagate, or transport a program for use by or in connection with an instruction execution system, apparatus, or device.

Program code embodied on a machine-readable medium can be transmitted using any appropriate medium, including but not limited to wireless, wireline, optical fiber cable, RF, etc., or any suitable combination of the foregoing.

Computer program code for carrying out operations for aspects of the disclosure can be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code can execute entirely on a stand-alone machine, can execute in a distributed manner across multiple machines, and can execute on one machine while providing results and or accepting input on another machine.

Terminology and Variations

The program code/instructions can also be stored in a machine-readable medium that can direct a machine to function in a particular manner, such that the instructions stored in the machine-readable medium produce an article of manufacture including instructions which implement the function/act specified in the flowchart and/or block diagram block or blocks.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed. A set of items can have only one item or more than one item. For example, a set of numbers can be used to describe a single number or multiple numbers.

EXAMPLE EMBODIMENTS

Example embodiments include the following:

Embodiment 1: A method comprising determining a bit design based on a design criterion, determining a cutter design to be mounted on the bit design at a bit design position based on cutter information, wherein the cutter information is based on a historical cutter performance metric of one or more cutters having the cutter design, generating a drill bit model based on the bit design and the cutter design, and determining that the drill bit model meets the design criterion.

Embodiment 2: The method of Embodiment 1, wherein the cutter information further comprises a cutter design grading value, wherein the cutter design grading value is based on a set of cutter grading values, and wherein the set of cutter grading values are determined using a machine-learning framework comprising a neural network.

Embodiment 3: The method of any of Embodiments 1 to 2, wherein the cutter design is a first cutter design, and wherein the bit design position is a first bit design position, and wherein the method further comprises selecting a second cutter design to be mounted on the bit design at a second bit design position based on the cutter information, wherein the first cutter design and the second cutter design are different, and wherein the first bit design position and the second bit design position are different.

Embodiment 4: The method of any of Embodiments 1 to 3, further comprising determining the design criterion based on planned drilling operation information, wherein the planned drilling operation information comprises at least one of a material attribute and planned drilling borehole width.

Embodiment 5: The method of any of Embodiments 1 to 4, wherein determining that the drill bit model meets the design criterion comprises performing a drilling simulation based on the drill bit model, and determining whether the drill bit model meets the design criterion based on a result of the drilling simulation.

Embodiment 6: The method of any of Embodiments 1 to 5, further comprising determining the design criterion based on at least one of a planned drilling location, planned drilling time, and planned drilling speed.

Embodiment 7: The method of any of Embodiments 1 to 6, wherein the historical cutter performance metric is correlated with a ratio of a first surface area of a cutter having the cutter design to a second surface area of the cutter having the cutter design, wherein the first surface area is covered in a material and a second surface area is not covered in the material.

Embodiment 8: A method comprising acquiring a set of cutter training images and a set of training design grading values, wherein each of the set of training design grading values is associated with one or more of the set of cutter training images, and generating a trained machine-learning framework from a machine-learning framework using the set of cutter training images as inputs and the set of training design grading values as target values in an objective function during training, wherein the trained machine-learning framework provide a cutter design based on a historical cutter performance metric and a cutter design grading value, wherein the cutter design grading value is in the set of training design grading values.

Embodiment 9: The method of Embodiment 8, wherein the objective function is a first objective function, and wherein the method further comprises acquiring a set of training historical bit design performance metrics and a set of training bit design parameters for the cutter, wherein each of the set of training bit design parameters is associated with one or more of the set of training historical bit design performance metrics, and wherein generating the trained machine-learning framework further comprises using the set of training historical bit design performance metrics as inputs and the set of training bit design parameters as target values in a corresponding objective function during training Embodiment 10: The method of any of Embodiments 8 to 9, further comprising determining a bit design parameter based on a design criterion, wherein the design criterion is used to filter possible bit designs.

Embodiment 11: The method of any of Embodiments 8 to 10, wherein the historical cutter performance metric comprises a metric that is correlated with a ratio of a cutter surface area covered in a cutting material to a cutter surface area not covered in a cutting material after one or more drilling operations.

Embodiment 12: The method of any of Embodiments 8 to 11, wherein the each of the set of training design grading values corresponds with a physical condition of a cutter.

Embodiment 13: The method of any of Embodiments 8 to 12, wherein each of the set of cutter training images are associated with one of a set of cutter positions on a drill bit, wherein generating the trained machine-learning framework comprises using the set of cutter positions as an input during training.

Embodiment 14: An apparatus comprising a processor, and a machine-readable medium having program code executable by the processor to cause the apparatus to determine a bit design based on a design criterion, determine a cutter design to be mounted on the bit design at a bit design position based on cutter information, wherein the cutter information is based on a historical cutter performance metric of one or more cutters having the cutter design, generate a drill bit model based on the bit design and the cutter design, and determine that the drill bit model meets the design criterion.

Embodiment 15: The apparatus of Embodiment 14, wherein the cutter information further comprises a cutter design grading value, wherein the cutter design grading value is based on a set of cutter grading values, and wherein the set of cutter grading values are determined using a machine-learning framework comprising a neural network.

Embodiment 16: The apparatus of any of Embodiments 14 to 15, wherein the cutter design is a first cutter design, and wherein the bit design position is a first bit design position, and wherein the program code further comprises program code which, when executed by the processor, is to select a second cutter design to be mounted on the bit design at a second bit design position based on the cutter information, wherein the first cutter design and the second cutter design are different, and wherein the first bit design position and the second bit design position are different.

Embodiment 17: The apparatus of any of Embodiments 14 to 16, further comprising program code which, when executed by the processor, is to determine the design criterion based on planned drilling operation information, wherein the planned drilling operation information comprises at least one of a material attribute and planned drilling depth.

Embodiment 18: The apparatus of any of Embodiments 14 to 17, wherein the program code which, when executed by the processor, is to determine that the drill bit model meets the design criterion further comprises program code to perform a drilling simulation based on the drill bit model, and determine whether the drill bit model meets the design criterion based on a result of the drilling simulation.

Embodiment 19: The apparatus of any of Embodiments 14 to 18, further comprising program code which, when executed by the processor, is to determine the design criterion based on at least one of a planned drilling location, planned drilling time, and planned drilling speed.

Embodiment 20: The apparatus of any of Embodiments 14 to 19, wherein the historical cutter performance metric is based on an expected performance lifetime.

What is claimed is:

1. A method comprising:

determining a bit design based on a design criterion;

determining a cutter design to be mounted on the bit design at a bit design position based on cutter information, wherein the cutter information is based on a historical cutter performance metric of one or more cutters having the cutter design, wherein the cutter information further comprises a cutter design grading value, wherein the cutter design grading value is based on a set of cutter grading values, and wherein the set of cutter grading values are determined using a machine-learning framework comprising a neural network;

generating a drill bit model based on the bit design and the cutter design; and determining that the drill bit model meets the design criterion.

2. The method of claim 1, wherein the cutter design is a first cutter design, and wherein the bit design position is a first bit design position, and wherein the method further comprises selecting a second cutter design to be mounted on the bit design at a second bit design position based on the cutter information, wherein the first cutter design and the second cutter design are different, and wherein the first bit design position and the second bit design position are different.

3. The method of claim 1, further comprising determining the design criterion based on planned drilling operation information, wherein the planned drilling operation information comprises at least one of a material attribute and planned drilling borehole width.

4. The method of claim 1, wherein determining that the drill bit model meets the design criterion comprises:

performing a drilling simulation based on the drill bit model; and determining whether the drill bit model meets the design criterion based on a result of the drilling simulation.

5. The method of claim 1, further comprising determining the design criterion based on at least one of a planned drilling location, planned drilling time, and planned drilling speed.

6. The method of claim 1, wherein the historical cutter performance metric is correlated with a ratio of a first surface area of a cutter having the cutter design to a second surface area of the cutter having the cutter design, wherein the first surface area is covered in a material and a second surface area is not covered in the material.

7. A method comprising:

acquiring a set of cutter training images and a set of training design grading values, wherein each of the set of training design grading values is associated with one or more of the set of cutter training images; and generating a trained machine-learning framework from a machine-learning framework using the set of cutter training images as inputs and the set of training design grading values as target values in an objective function during training, wherein the trained machine-learning framework provide a cutter design based on a historical cutter performance metric and a cutter design grading value, wherein the cutter design grading value is in the set of training design grading values.

8. The method of claim 7, wherein the objective function is a first objective function, and wherein the method further comprises:

acquiring a set of training historical bit design performance metrics and a set of training bit design parameters for the cutter, wherein each of the set of training bit design parameters is associated with one or more of the set of training historical bit design performance metrics; and wherein generating the trained machine-learning framework further comprises using the set of training historical bit design performance metrics as inputs and the set of training bit design parameters as target values in a corresponding objective function during training.

9. The method of claim 7, further comprising determining a bit design parameter based on a design criterion, wherein the design criterion is used to filter possible bit designs.

10. The method of claim 7, wherein the historical cutter performance metric comprises a metric that is correlated with a ratio of a cutter surface area covered in a cutting material to a cutter surface area not covered in a cutting material after one or more drilling operations.

11. The method of claim 7, wherein the each of the set of training design grading values corresponds with a physical condition of a cutter.

12. The method of claim 7, wherein each of the set of cutter training images are associated with one of a set of cutter positions on a drill bit, wherein generating the trained machine-learning framework comprises using the set of cutter positions as an input during training.

13. An apparatus comprising:

a processor; and a machine-readable medium having program code executable by the processor to cause the apparatus to, determine a bit design based on a design criterion, determine a cutter design to be mounted on the bit design at a bit design position based on cutter information, wherein the cutter information is based on a historical cutter performance metric of one or more cutters having the cutter design, wherein the cutter information further comprises a cutter design grading value, wherein the cutter design grading value is based on a set of cutter grading values, and wherein the set of cutter grading values are determined using a machine-learning framework comprising a neural network, generate a drill bit model based on the bit design and the cutter design, and determine that the drill bit model meets the design criterion.

14. The apparatus of claim 13, wherein the cutter design is a first cutter design, and wherein the bit design position is a first bit design position, and wherein the program code further comprises program code which, when executed by the processor, is to select a second cutter design to be mounted on the bit design at a second bit design position based on the cutter information, wherein the first cutter design and the second cutter design are different, and wherein the first bit design position and the second bit design position are different.

15. The apparatus of claim 13, further comprising program code which, when executed by the processor, is to determine the design criterion based on planned drilling operation information, wherein the planned drilling operation information comprises at least one of a material attribute and planned drilling depth.

16. The apparatus of claim 13, wherein the program code which, when executed by the processor, is to determine that the drill bit model meets the design criterion further comprises program code to:

perform a drilling simulation based on the drill bit model; and determine whether the drill bit model meets the design criterion based on a result of the drilling simulation.

17. The apparatus of claim 13, further comprising program code which, when executed by the processor, is to determine the design criterion based on at least one of a planned drilling location, planned drilling time, and planned drilling speed.

18. The apparatus of claim 13, wherein the historical cutter performance metric is based on an expected performance lifetime.

* * * * *